(12) United States Patent
Hill

(10) Patent No.: US 6,370,673 B1
(45) Date of Patent: Apr. 9, 2002

(54) METHOD AND SYSTEM FOR HIGH SPEED DETAILED PLACEMENT OF CELLS WITHIN AN INTEGRATED CIRCUIT DESIGN

(75) Inventor: Dwight Hill, San Carlos, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 09/273,809

(22) Filed: Mar. 22, 1999

(51) Int. Cl.$^7$ .............................................. G06F 17/50
(52) U.S. Cl. .................................. 716/2; 716/9; 716/10
(58) Field of Search ........................................ 716/2–10

(56) References Cited

U.S. PATENT DOCUMENTS 5,625,568 A * 4/1997 Edwards et al. ................ 716/2
6,026,223 A * 2/2000 Scepanovic et al. ........... 716/10

\* cited by examiner

Primary Examiner—David Nelms
Assistant Examiner—Gene N. Auduong
(74) Attorney, Agent, or Firm—Wagner, Murabito&Hao LLP

(57) ABSTRACT

A method and system for high speed detailed placement of cells within an integrated circuit design. The novel detailed placement system receives a set of cells of an integrated circuit design where the cells have undergone coarse placement. Cells have variable width but the same height (or vice-versa). The cells are each assigned an initial coordinate position, e.g., using floating point precision values. During detailed placement, the cell coordinates are assigned to x-axis and y-axis grid lines. The detailed placement process sorts the cells based on their coordinates along a first axis, e.g., their x-axis coordinates; sort order dictates cell placement order. In one embodiment, sort order preference is given to the wider cells. For a given cell, placement is performed by scanning through the rows of the substrate and selecting the left-most positioned vacant site of each row as a candidate site for placement. A site is vacant if it does not contain a previously placed cell. Of the candidate sites, a valid site having the lowest cost (e.g., the nearest site) is selected for the cell. Some candidate sites are invalid due to the presence of obstructions or incompatible metal layers. A candidate site can also be invalid if it lies too far to the left of the cell, based on a left factor. Placement from left to right along the rows continues in this manner until all cells are placed. Alternatively, the process could run right to left, down to up or up to down.

18 Claims, 18 Drawing Sheets

METHOD AND SYSTEM FOR HIGH SPEED DETAILED PLACEMENT OF CELLS WITHIN AN INTEGRATED CIRCUIT DESIGN

BACKGROUND OF THE INVENTION

1. Field of the Invention

The present invention relates to the field of electronic design automation (EDA). More specifically, the present invention relates to layout placement of cells within the field of electronic design automation used in the design and fabrication of integrated circuit devices.

2. Related Art

The rapid growth of the complexity of modern electronic circuits has forced electronic circuit designers to rely upon computer programs to assist and automate most steps of the integrated circuit design process. Typical circuits today contain hundreds of thousands or millions of individual pieces or "cells." In many design architectures, the cells can have variable widths but constant heights or the cells can have variable heights but constant widths. Modern integrated circuit designs are much too large for a circuit designer or even an engineering team of designers to manage effectively by manual techniques. To automate the circuit design and fabrication of integrated circuit devices, electronic design automation (EDA) systems have been developed.

Within the automatic design process, an integrated circuit description is translated, by circuit synthesis processes, from a high level design language (HDL) format into a netlist description. The netlist description ("netlist") contains technology specific cells that are connected together by wire connections. The cells of the netlist are then placed by computer implemented placement processes that include a coarse placer process (also called a "global" placer). The coarse placer process assigns each cell with a substrate location defined by two dimensional coordinates (x, y). The coarse placer process places the cells in an effort to maintain certain circuit constraints such as: wire length minimization; signal delay minimizations; power constraints and substrate area constraints. The coarse placer process attempts to improve the quality of the integrated circuit design by minimizing the wire lengths between connected cells. The coarse placer process also avoids cell overlap with large obstacles.

However, the cell locations assigned by the coarse placer process are not initially legal locations for the cells because the coarse placer process assigns precise cell coordinates using floating point values. In the actual physical device, cells need to be assigned to locations that align within a matrix of allowable x and y discrete grid lines. Also, the cell locations determined by the coarse placer process may not be legal due to cell-to-cell overlaps or overlaps between cells and small obstacles. As a result of the above, a detailed (also called "fine") placement process is used on the results of the coarse placer. The detailed placement process yields a legal cell placement that satisfies the following: (1) it aligns all cells to the x and y grid lines; (2) it contains no cell-to-cell overlaps; and (3) it contains no cell-to-obstacle overlaps. The detailed placement process generally does not attempt to improve wire length of the design, rather, it slightly degrades wire length in an effort to arrive at legal cell placements.

FIG. 1A illustrates a portion 10 of an exemplary cell layout as generated by a coarse placement process. Layout portion 10 contains cells 20a–20g having their upper left corners located at floating point coordinate positions that do not necessarily align with the horizontal 12 and vertical 14 lines of the (x, y) grid matrix. Therefore, these initial cell placements are not legal. For instance, assume cell 20a is located at (12.34, 43.92); cell 20b is located at (12.24, 47.52); cell 20c is located at (30.19, 47.56); cell 20d is located at (52.34, 16.12); cell 20e is located at (28.56, 59.11); cell 20f is located at (13.89, 69.21); and cell 20g is located at (39.01, 68.32). These placements from the coarse placer process are then provided to a detailed placer of the prior art which attempts to align the cells with the discrete (x, y) grid lines.

One prior art detailed placer process "snaps" all of the cells to their nearest grid intersection in an attempt to align the cell locations with the grid matrix. FIG. 1B illustrates such an output where the cells 20a–20g are "snapped" to the nearest grid intersection. For instance, cell 20c is snapped to location (30, 45), cell 20d is snapped to location (15, 50), cell 20e is snapped to location (25, 55), cell 20f is snapped to location (15, 65) and so forth. However, cells 20b and 20a share the same grid location (10, 40) and therefore overlap with each other. This detailed placement process of the prior art has a disadvantage in that many cells, after being snapped to their nearest grid locations, end up overlapping other cells, sometimes causing thousands of overlaps. The problem is severe because when the detailed placer process attempts to move an overlapping cell to another location, it must also check for a possible overlap condition at the new location, and so forth. This process of moving cells, checking for overlapping conditions and moving cells, etc., can take many iterations per cell thereby consuming a relatively large amount of processing time. In an effort to reduce this problem, complex, detailed and time consuming programming processes are introduced which add processing penalties and technical complexities to the detailed placer process.

In addition to taking a relatively large amount of processing time to complete, this prior art method of detailed placement also causes some cells to be moved quite a distance from their original position in order to locate a non-overlapping site. This is especially true for high density cell layouts. Another disadvantage of this prior art detailed process is that it does not fully take advantage of the two dimensional nature of the detailed placement problem and thereby generates cell placements that are not typically uniform in nature. Another disadvantage of this detailed cell placement process is that it does not easily or readily deal with cell obstructions. In order to cope with cell obstructions in the layout area, complex and detailed heuristics need to be incorporated into the prior art detailed placement process.

Accordingly, what is needed is a detailed placer process that yields grid aligned legal coordinates but does not consume a relatively long processing period to compute. What is also needed is a detailed placer process that does not move the cells very far from their original positions as determined from the coarse placer process. What is needed further is a detailed placer process that yields a relatively uniform placement while avoiding cell-to-cell overlaps and avoiding cell-to-obstruction overlaps. The present invention provides these advantages. These and other advantages of the present invention not specifically mentioned above will become clear within discussions of the present invention presented herein.

SUMMARY OF THE INVENTION

A method and system are described herein for high speed detailed placement of cells within an integrated circuit design. The novel detailed placement system receives a set of cells of an integrated circuit design where the cells have undergone coarse placement. Cells have variable width but the same height (or vice-versa in other embodiments). As a result of coarse placement, the cells are each assigned an initial coordinate position, e.g., using floating point precision values. During detailed placement, the cell coordinates are assigned to non-overlapping positions within x-axis and y-axis grid lines.

The detailed placement process of the present invention sorts the cells based on their coordinate values along a first axis, e.g., their x-axis coordinates. This sort order dictates the cell placement order during the detailed placement process. In one embodiment, sort order preference is given to the wider cells to place them earlier in the placement process. Preference can be given, in one implementation, by subtracting a weighted product of the cell's width from the cell's initial coordinate position. For a given cell, placement is performed by scanning through the rows of the substrate and selecting the left-most positioned vacant cell site of each row as a candidate site for placement of the given cell. A group of candidate sites is determined because each row yields a candidate. A cell site is a grid based placement position. A site is vacant if it does not contain a previously placed cell. Of the candidate sites, a valid site having the lowest cost (e.g., the nearest site) is selected for the given cell. Some candidate sites are invalid due to the presence of obstructions or incompatible metal layers in the integrated circuit design. A candidate site can also be invalid if it lies too far to the left of the cell, based on a determined left factor. Placement from left to right along the rows continues in the above manner until all cells are detail placed. Alternatively, the placement process of the present invention could run right to left, down to up or up to down. The present invention operates particularly well for integrated circuit designs having 97 percent utilization or less.

Embodiments of the present invention include a computer controlled detailed placement method having the steps of: a) accessing a netlist description of an integrated circuit having cells of a common height wherein each cell has assigned thereto an initial two dimensional coordinate position within an area; b) sorting the cells into a sort order based on a coordinate value of each cell; c) assigning a plurality of rows to the area; d) based on the sort order, selecting an unaligned cell and traversing the plurality of rows to determine candidate sites for placement of the unaligned cell wherein the candidate sites are the left-most vacant sites of each row and wherein each candidate site is aligned within a two dimensional grid matrix; e) placing the unaligned cell in a lowest cost candidate site of the candidate sites of step d); and f) aligning all of the cells to the grid matrix by repeating steps d)–e) for each cell of the netlist description.

Embodiments include the above and where step e) comprises the steps of: e1) determining the lowest cost site by selecting a candidate site that is closest to the initial coordinate position of the unaligned cell; and e2) placing the unaligned cell in the lowest cost candidate site as determined at the step e1). Embodiments include the above and wherein the coordinate value of step b) is within a horizontal coordinate axis and wherein the step b) comprises the steps of: b1) assigning a new coordinate position to each cell by shifting each cells' horizontal coordinate position by an amount dependent on the width of each cell; and b2) weighting wider cells higher in the sort order by sorting the cells based on their new coordinate positions as determined at step b1). Embodiments also include a computer system implemented in accordance with the above.

DETAILED DESCRIPTION OF THE INVENTION

Figure 1A:
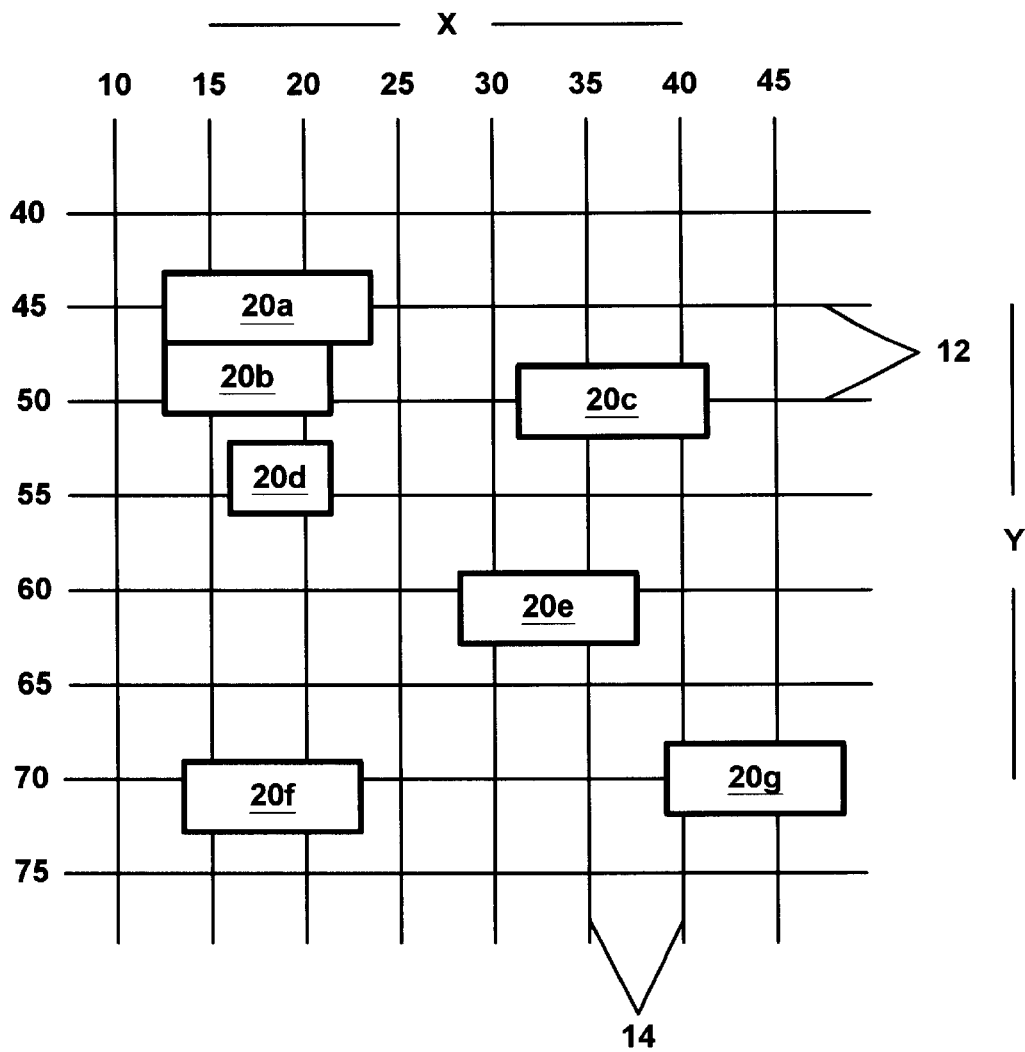
FIG. 1A is a layout view of a portion of coarsely placed integrated circuit cells of an integrated circuit design.
Figure 1B:
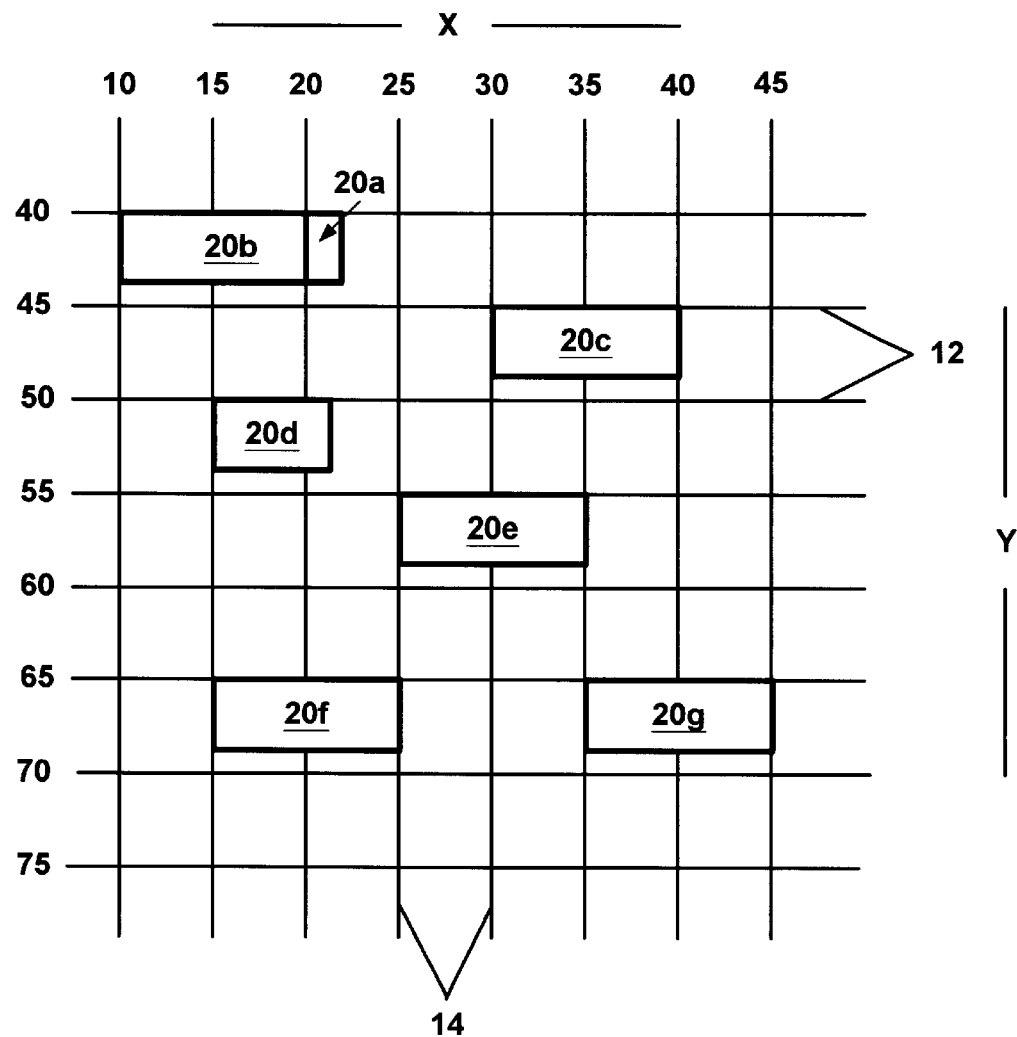
FIG. 1B is a layout view of the integrated circuit design portion of FIG. 1A after being partly processed by a detailed placer of the prior art.

In the following detailed description of the present invention, a detailed cell placer process, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM PLATFORM 112

Aspects of the present invention are discussed in terms of steps executed on a computer system (e.g., design process 200 and detailed placement process 260). These steps are implemented as program code stored in computer readable memory units of a computer system and are executed by the processor of the computer system. Although a variety of different computer systems can be used with the present invention, an exemplary general purpose computer system 112 is shown in FIG. 2.

Figure 2:
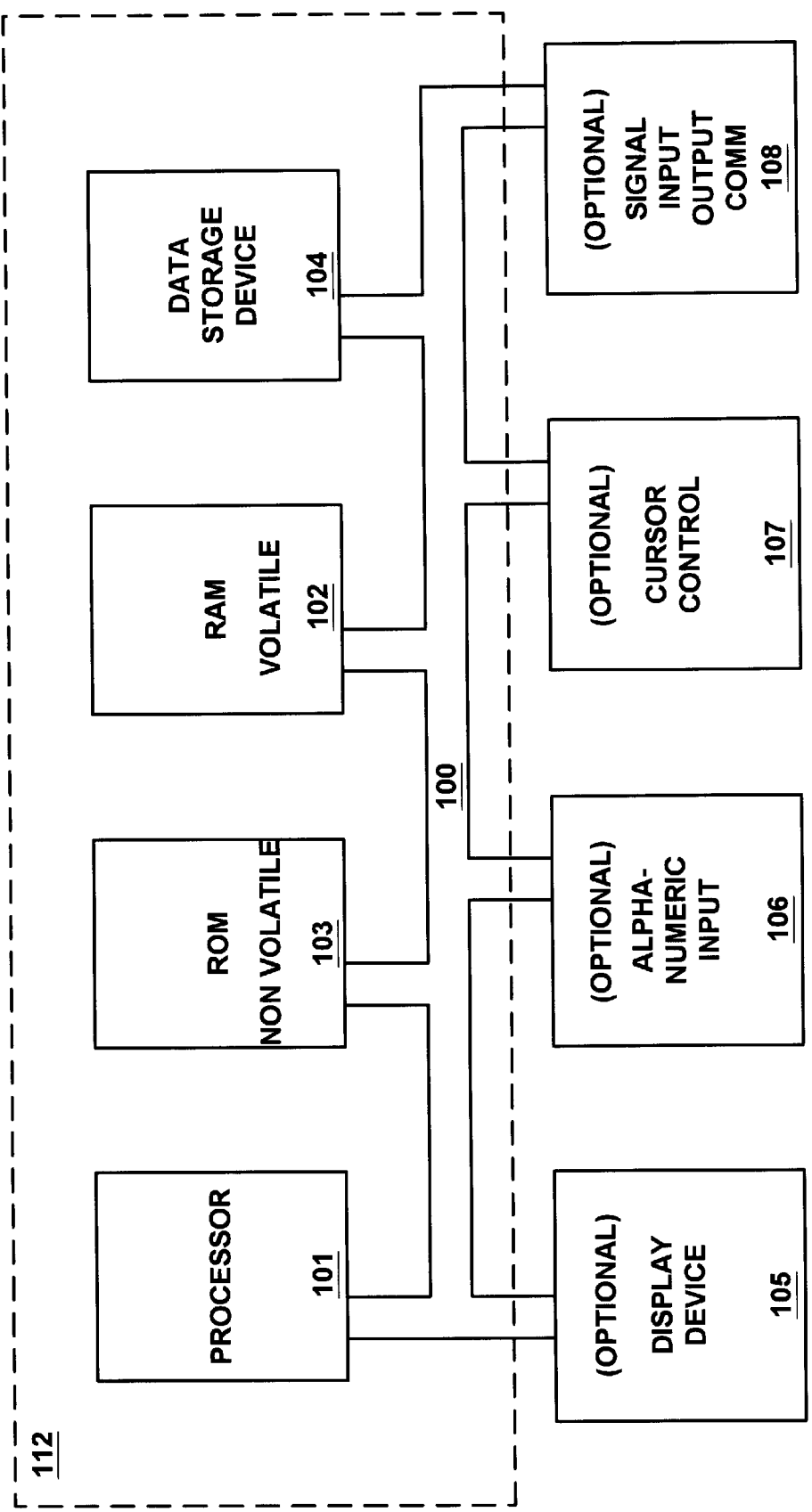
FIG. 2 is a diagram of a computer system platform for operating embodiments of the detailed placer process of the present invention.

In general, computer system 112 of FIG. 2 includes an address/data bus 100 for communicating information, a central processor 101 coupled with the bus 100 for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are also called computer readable memories. Memory units of computer system 112 include 102, 103 and 104.

Also included in computer system 112 of FIG. 2 is an alphanumeric input device 106 including alphanumeric and function keys coupled to the bus 100 for communicating information and command selections to the central processor 101. Computer system 112 also includes an optional cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters on a display screen and recognizable to the user.

ELECTRONIC DESIGN AUTOMATION PROCESS

Figure 3:
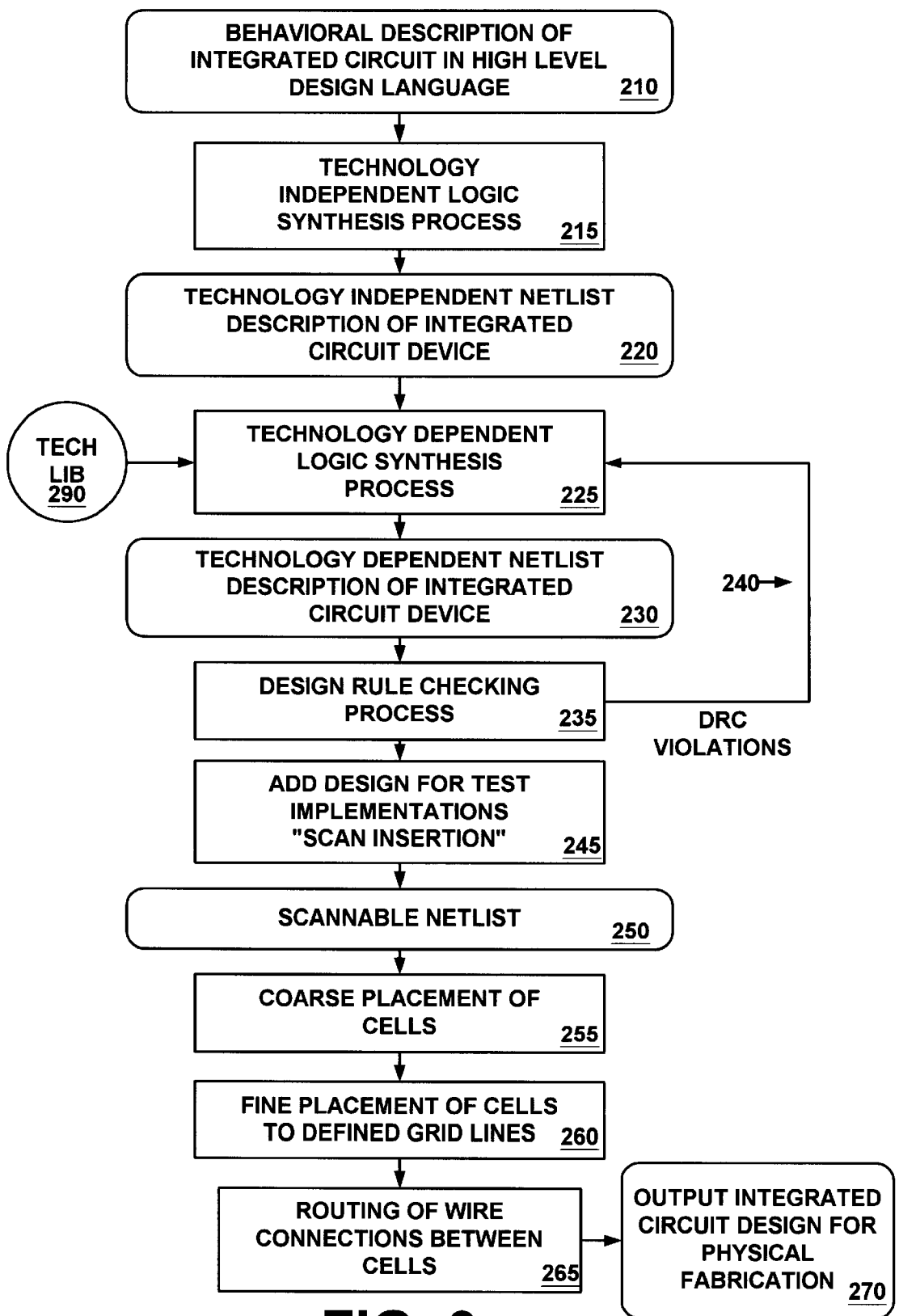
FIG. 3 is a flow diagram of an automated integrated circuit design process of the present invention including the detailed placer of the present invention.

FIG. 3 illustrates an electronic design automation (EDA) process 200 that utilizes the detailed ("fine") placement process 260 of the present invention. EDA process 200 represents the steps performed by a computer system 112 for designing integrated circuit (IC) devices. The EDA process 200 typically receives one or more high level behavioral descriptions of the IC device (e.g., in HDL languages like VHDL, Verilog, etc.) and translates this description into netlists of various levels of abstraction, as described below. Specifically, the behavior of the IC device can be represented in a behavioral description 210 which generally is represented in a high level design language format. This description 210 is then translated, utilizing well known logic synthesis processes 215, into a technology independent circuit description or "netlist" 220 which is stored in computer readable memory units of EDA system 112. One such computer implemented synthesis process is the "Design Compiler" commercially available from Synopsys of Mountain View, Calif.

At a higher level of abstraction, a generic netlist 220 is typically produced based on technology independent primitives. The generic netlist 220 can be translated by other logic synthesis processes 225 into a lower level technology-specific netlist 230 based on a technology-specific library 290 that has gate-specific models for timing and power estimation. Netlist 230 is similar to netlist 220 but contains technology specific cells and specific pin connections between the cells. Netlist 230 can be represented using a directed cyclic graph structure having cells which are connected to each other with wires. The netlist 230 is typically stored in computer readable memory within the EDA system 112 and processed and verified using many well known techniques.

At step 235 of FIG. 3, the technology specific netlist 230 is processed by a well known design rule checker 235 that tests for specified circuit design violations. If violations exist, a designer can redesign the IC circuit as shown by 240 and then perform part of EDA process 200 over again. At step 245, special design for test (DFT) circuit implementations can optionally be added to the verified IC design so that the resultant integrated circuit device can be made easier to test for manufacturing faults. These DFT circuit implementations can be added automatically using well known "scan-insertion" processes. The result of the scan-insertion process 245 is a "scannable" netlist having the original IC design elements of netlist 230 and the added DFT circuit implementations of step 245.

A netlist is a description of the electronic circuit which specifies what cells compose the circuit and the manner in which cells are connected together using wires. Importantly, netlist description 250 does not specify the location, on a silicon substrate, of where the cells are placed or where the wires run which connect cells together. Determining this geometric information is the function of computer controlled placement processes 255,260 and a computer controlled routing process 265.

At step 255 of FIG. 3, netlist 250 is processed by a coarse placement process. Netlist 250 may contain obstructions and regularities. The coarse placement process 255 determines a location for each cell on a silicon area. The cell locations are specified in two dimensional spatial coordinates, e.g. (x, y) coordinates, on the silicon substrate area. The locations are typically selected to optimize certain circuit objectives such as wire length, wire routibility, circuit speed, circuit power consumption, and/or other criteria, subject to the condition that the cells are spread evenly over the silicon area and that the cells do not generally overlap with each other. Coarse placement process 255 determines floating point coordinates for all cells and these cell positions may have cell-to-cell overlaps and/or may have overlaps between small obstructions and cells. Because the floating point coordinates are not aligned with a grid matrix, they are invalid for fabrication and are therefore called "initial" coordinate positions. The output of the coarse cell placement process 255 includes a netlist having a data structure containing the (x, y) cell locations, in floating point precision, for each cell of the IC design.

The fine or "detailed" placer process 260 of FIG. 3 accepts the output of the coarse placer 255 and repositions the cells from their initial positions into legal locations. The detailed placer 260 of the present invention repositions ("aligns") the cells of the netlist to positions that lie on grid lines of the grid matrix (forming a "grid of sites"). The detailed placer 260 also eliminates any cell-to-cell overlaps and/or any overlaps between cells and obstructions. The output of the detailed placer 260 contains aligned cells and is forwarded to the router process 265 for wire routing. The detailed placer 260 generates a high quality cell placement in a single pass and is able to produce a non-overlapping placement in roughly N*log(N) time where N is the number of cells, with no cell being moved very far from its original initial position.

It is appreciated that the grid of sites does not necessarily have to be made up of grid sites that are of uniform width. For instance, it is possible to have 6 skinny sites followed by 2 wide sites then 6 skinny sites, etc. This is the manner in which CBA technology operates with "compute" (skinny) and "drive" (wide) sites, and a cell library with some cells designed to fit on one or the other type of site, or on a combination of sites (e.g., one drive next to two computes). It is appreciated that the placement process of the present invention operates well within this environment.

The router 265 of FIG. 3 generates wire geometry for connecting pins together. The wire geometry data structure and cell placement data structure together are used to make the final geometric database 270 needed to fabricate the integrated circuit device. Routers typically include a course routing process and a fine routing process. The coarse router provides a general path for the routing that is done at the detail stage. The coarse router examines at the level of the whole integrated circuit chip and its available resources and determines what the rough pathways should be from a topological standpoint. The fine or detail router lays down the actual geometries and connected wire segments in the appropriate layers as a wire connection may span multiple layers. The fine router creates wire routes that are "clean," e.g., do not have design rule violations, do not overlap other structures and can be fabricated.

One result of EDA process 200 is a physical device layout in mask form 270 which can be used to directly implement structures in silicon to realize the physical IC device.

DETAILED PLACEMENT PROCESS OF THE PRESENT INVENTION

Figure 4A:
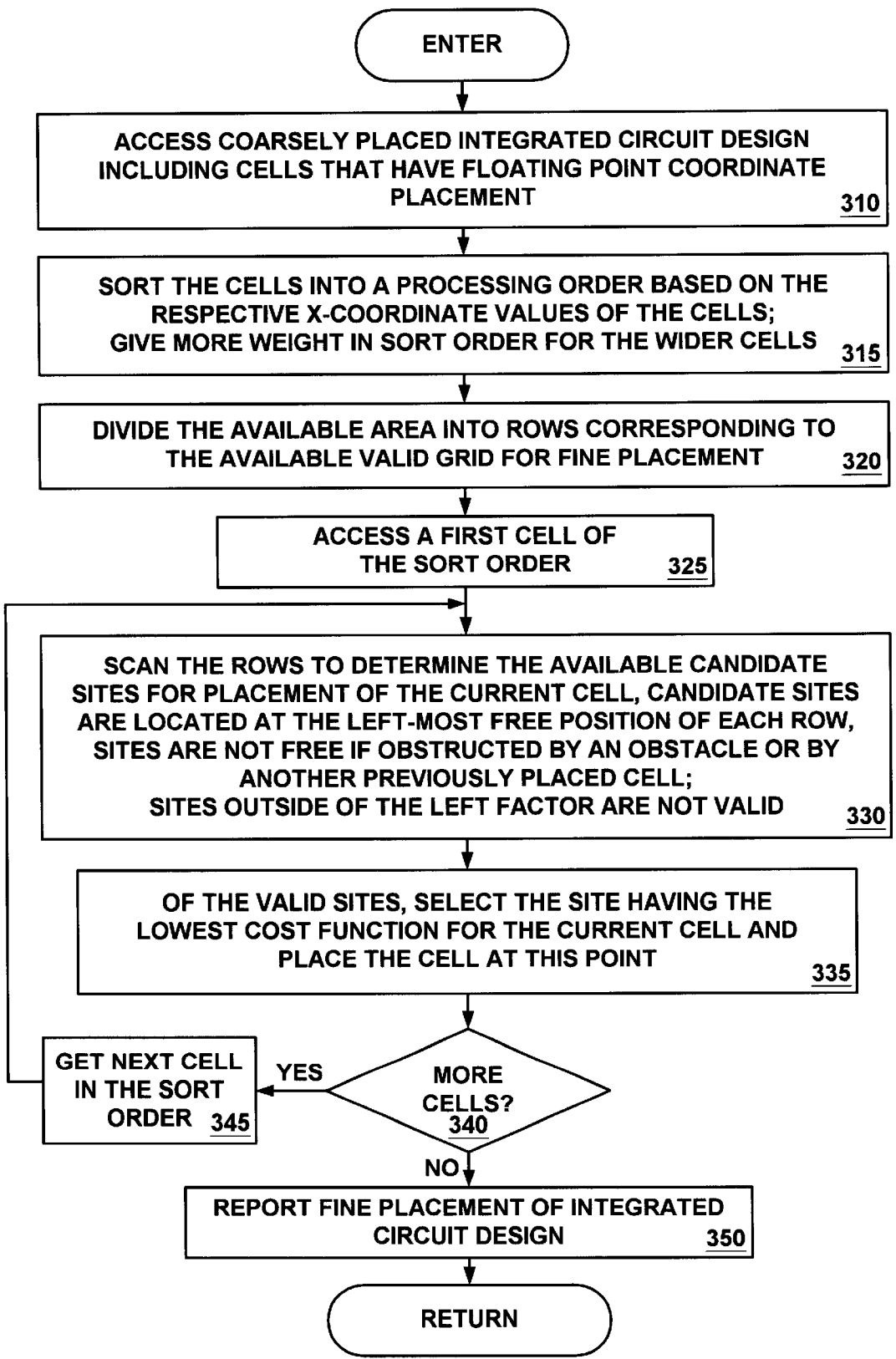
FIG. 4A is a flow diagram illustrating steps of the detailed placer process of the present invention.
Figure 4B:
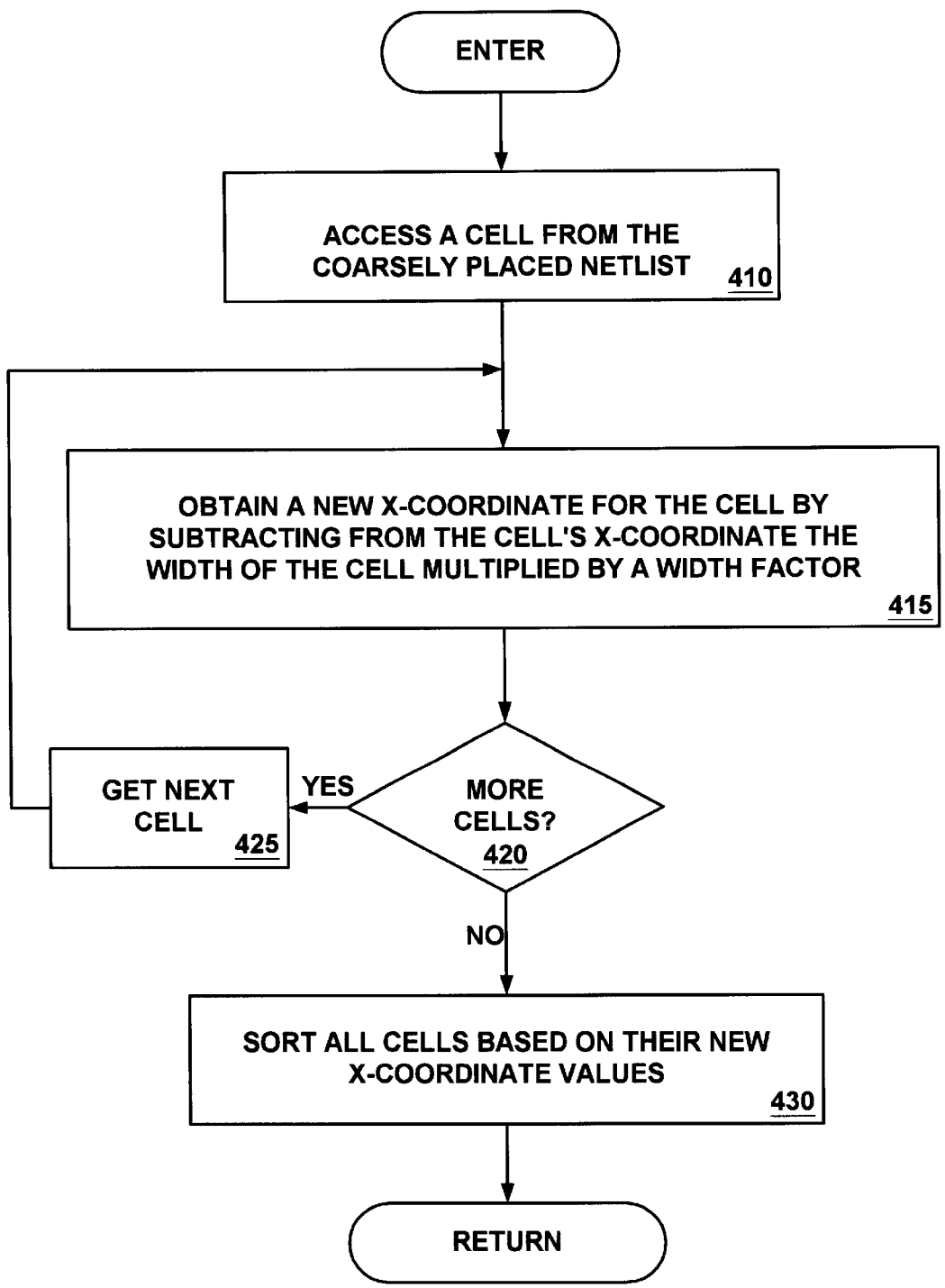
FIG. 4B is a flow diagram illustrating steps of the cell sort process of the detailed placer process of the present invention.
Figure 4C:
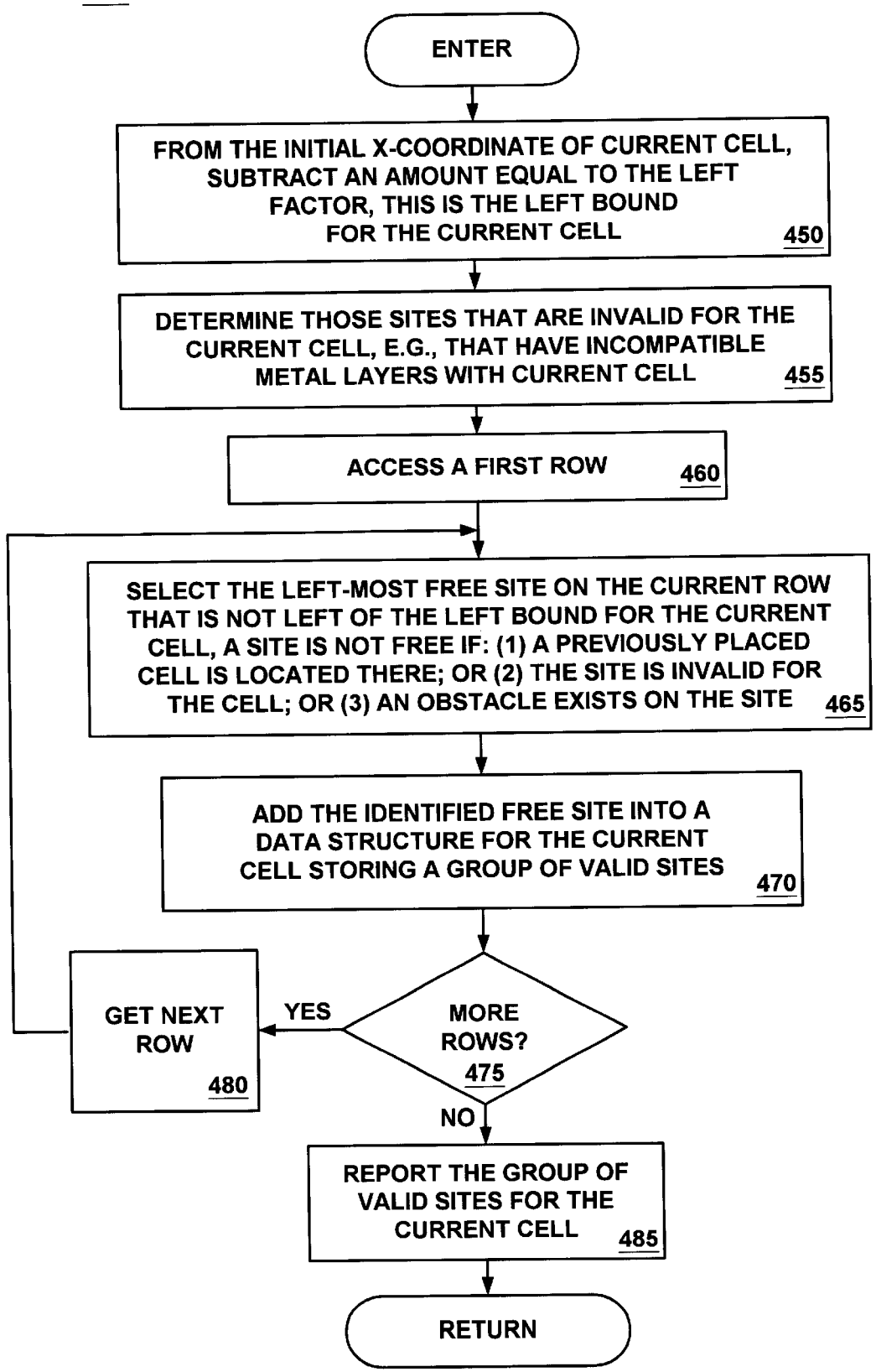
FIG. 4C is a flow diagram illustrating steps of the candidate site location process of the detailed placer process of the present invention for a given cell.

FIG. 4A, FIG. 4B and FIG. 4C are flow diagrams illustrating the steps and processes of the detailed placement process 260 ("detailed placer") of the present invention. Detailed placement process 260 is realized as instruction or program code stored in computer readable memory units of system 112 and executed by processor 101. At step 310 of FIG. 4A, the detailed placer 260 of the present invention accepts a list of cells that have been initially placed, e.g., by a coarse placer process. The cells each have an original or "initial" coordinate position that is generally not expected to lie within a "site," e.g., the initial coordinate positions of the cells are in floating point precision and are not aligned with grid lines of a grid matrix. The initial placement of the cells received at step 310 may also have cell-to-cell overlaps and cell-to-obstruction overlaps.

A typical site is approximately 5 microns wide and 10 microns tall but could be of any size. A typical cell can therefore occupy between 1–5 sites. When a "site" is discussed herein, it is appreciated that what is being referred to is the first site of a cell's occupancy for instances where more than one cell site is required for cell placement.

Figure 5A:
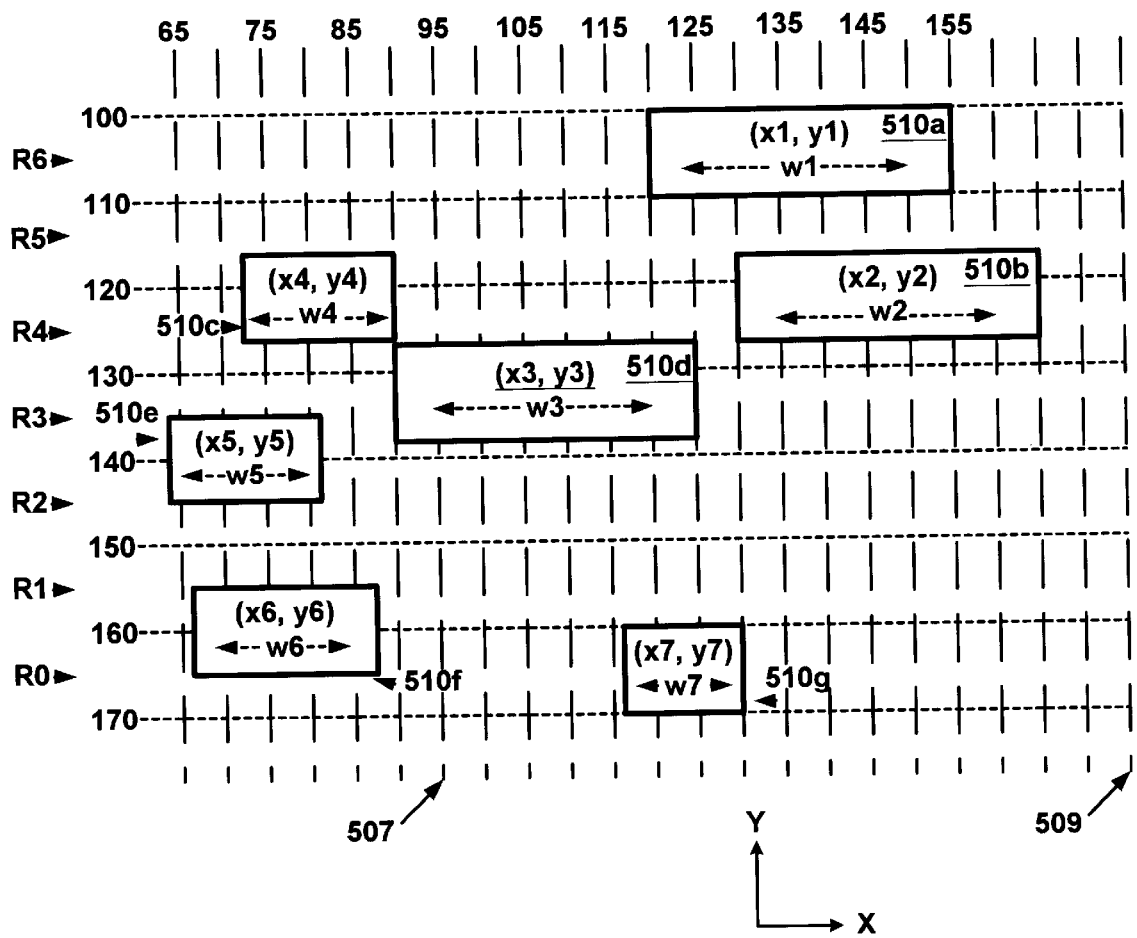
FIG. 5A is an exemplary cell layout after coarse placement and before cell sorting, showing example cells, their locations and widths.

FIG. 5A illustrates an exemplary layout portion 505 as received at step 310 of FIG. 4A. Layout 505 contains exemplary cells 510a–510g, each cell having an initial (x, y) coordinate position and a width, w. The cells received at step 310 have the same height but can have variable widths, e.g., w1–w7. Also shown in FIG. 5A are the horizontal 509 and vertical 507 grid lines of the grid matrix. Cell sites are positions that can be fabricated and are therefore located only on the grid matrix. A horizontal portion, e.g., from 100 to 170, and a vertical portion, e.g., 65 to 155, of the grid matrix are shown in FIG. 5A. Rows are defined as between the horizontal grid lines. For instance, rows R0–R6 are shown. The cells 510a–510g of the exemplary placement 505 do not have legal positions because they are not necessarily aligned with the discrete horizontal and vertical grids of the grid matrix. For instance, Table I below illustrates the exemplary initial (x, y) coordinates of cells 510a–510g.

TABLE I

| Cell | Initial x-coordinate | Initial y-coordinate |
|---|---|---|
| 510a | 119.95 | 100.12 |
| 510b | 131.06 | 118.63 |
| 510c | 73.77 | 118.54 |
| 510d | 90.56 | 128.87 |
| 510e | 64.02 | 137.99 |

TABLE I-continued

| Cell | Initial x-coordinate | Initial y-coordinate |
|---|---|---|
| 510f | 66.53 | 157.34 |
| 510g | 117.87 | 160.45 |

In accordance with the present invention, a cell becomes "aligned," or detail placed, when the detailed placer 260 repositions the cell to a cell site, e.g., a position that aligns with the grid matrix shown in FIG. 5A. In a typical case, the total cell layout area can contain as many as 50–1000 rows and a typical IC design can have as many as 100,000–175,000 individual cells to be placed.

At step 315 of FIG. 4A, the detailed placer 260 sorts the cells into a sort order based on their initial x-coordinates. The detailed placer 260 uses the sort order in the final placement process to determine the cell selection order for placement. In one embodiment, the sort order is entirely determined based on the initial x coordinate value (also called "horizontal" coordinate) of the cells. Once the cells are sorted into the sort order, the sort order is stored in computer memory to be used as described further below.

FIG. 4B illustrates the preferred embodiment of sort process 315 that gives wider cells a preference in the sort order. This embodiment orders larger cells higher in the sort order based on their width and their initial x-coordinate. At step 410, a cell is accessed from the list received at step 310 (FIG. 4A). At step 415, the present invention determines a new x-coordinate value for the cell according to the following relationship:

$$x(new)=x(old)-width\_of\_cell*width\_factor$$

where x(new) is the new "initial" x-coordinate for the cells, x(old) is the original "initial" x-coordinate of the cells, width_of_cell is the width of the cell and the width_factor is a constant. In the general case, width_factor is typically between 1.0 and 2.0, but can be adjusted depending on the utilization of the input design. The wider the cell, the higher in the sort order it can be placed relative to its original initial position. It is appreciated that the new x-coordinates generated by step 315 do not necessarily align with the grid matrix and are therefore still not legal positions but are used for cell sorting.

Figure 5B:
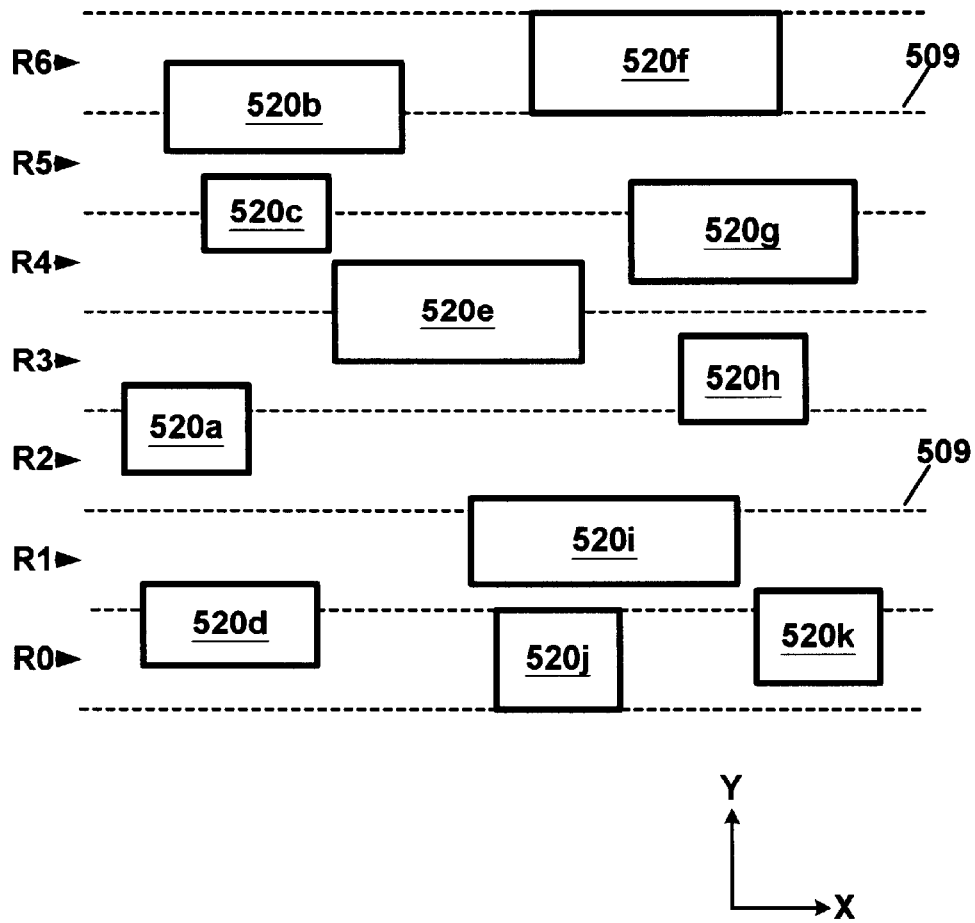
FIG. 5B is an exemplary cell layout after coarse placement and after cell sorting, showing example cells, their locations and widths.

As shown by steps 420 and 425, this coordinate adjustment is performed for all cells received by step 310 (FIG. 4A). It is appreciated that the y-coordinate values of the cells are not altered by the above process. At step 430, the present invention then sorts the cells from left to right based on their new x-coordinate values to produce a sort order. The sort order is then saved in computer memory. FIG. 5B illustrates a layout 515 of exemplary cells after being sorted by step 315. The cells 520a–520k are shown with their new initial x-coordinate positions. The exemplary sort order of layout 515 is based on the new initial x-coordinate positions of the cells and the new sort order is shown in Table II below:

TABLE II 520a
520d
520b
520c
520e
520i

TABLE II-continued 520j
520f
520g
520h
520k

The present invention will use the above sort order for accessing cells to be detail placed.

At step 320 of FIG. 4A, the available substrate area is divided into horizontally aligned rows which correspond to the grid matrix for placing the cells. The grid matrix is typically already defined before the detailed placer 260 operates. Therefore, step 320 is merely the assigning of row numbers or row identifiers to the spaces between the horizontal grid lines 509 of the grid matrix. For instance, at step 320, rows R0–R6 are identified between their respective horizontal grid lines as shown in FIG. 5A and FIG. 5B. In one embodiment, the height of each row is equal to the height of each cell; that height being the same for all cells.

At step 325 of FIG. 4A, the present invention accesses a first cell of the sort order, this is the current unaligned cell, also called the cell "to be placed." At step 330, the present invention places the current unaligned cell in a vacant site of the grid matrix. Generally, step 330 operates by filling sites of the rows from left to right based on the distances between the vacant sites and the current unaligned cell. In this way, the substrate area is filled from left to right forming a moving edge of placed cells. A site is not vacant if occupied by a previously placed cell and/or occupied by an obstruction. For a current unaligned cell, step 330 scans the rows to determine the left-most vacant cell site for each row. These are candidate sites for detailed placement of the current unaligned cell. The lowest-cost candidate site is then selected for cell placement. This continues until all of the cells have been placed into a row site.

Figure 5C:
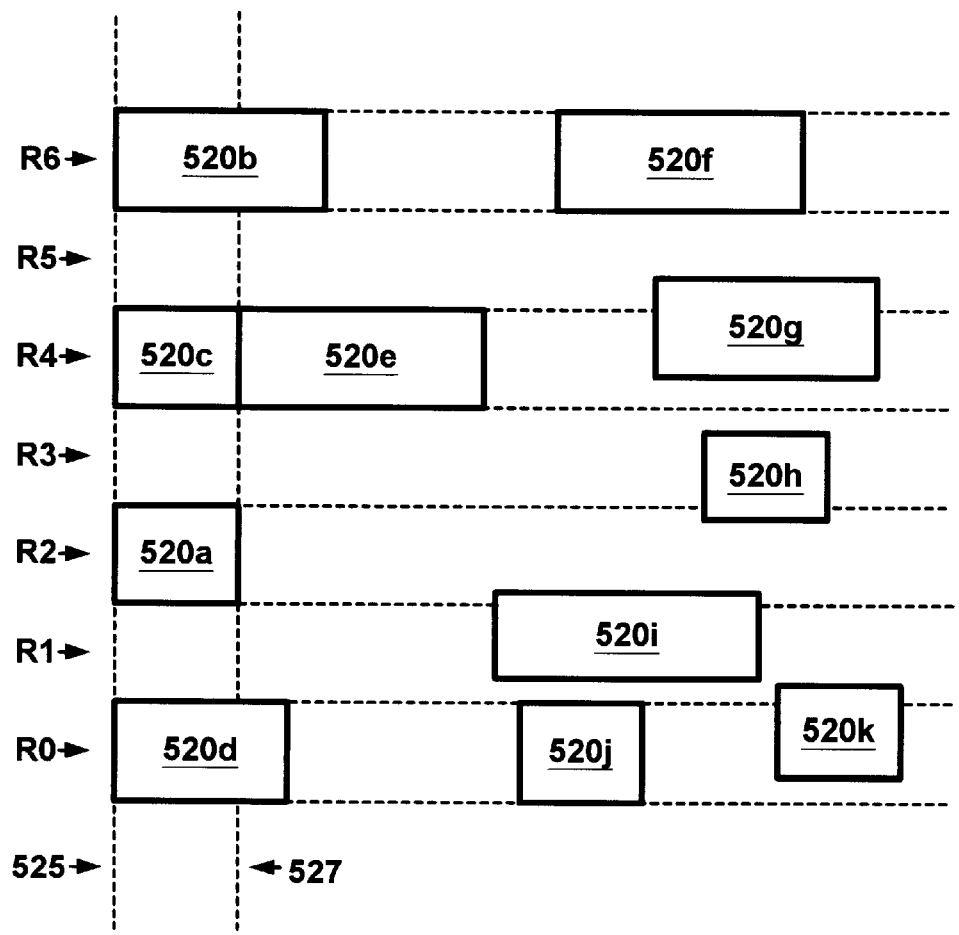
FIG. 5C illustrates the exemplary cell layout of FIG. 5B after five cells have been placed by the detailed placer process of the present invention.

FIG. 5C illustrates detailed placement or "alignment" of cells 520a–520e according to step 330. FIG. 5B illustrates the original positions of cells 520a–520e. As shown, cell 520a is moved to the left-most vacant site of row R2 and aligned with vertical grid line 525. Likewise, cell 520b is moved to the left-most vacant site of row R6 and aligned with vertical grid line 525. Cell 520c is moved to the left-most vacant site of row R4 and aligned with vertical grid line 525. Although cell 520e can be moved to the left-most vacant site of row R3 (or row R5), its placed location within row R4 of FIG. 5C, e.g., aligned with vertical grid line 527, is actually closer to its original location which is shown in FIG. 5B. Therefore, cell 520e is moved to row R4 next to cell 520c because this is the lowest cost left-most vacant row site. The remaining cells 520f–520k of FIG. 5C are still in the sort order and have not been processed by step 330.

The placement process 330 is described in more detail in FIG. 4C which assumes that a current unaligned cell has already been selected for placement. In the preferred embodiment, cells are only allowed to move left by a prescribed amount in an effort to keep cell displacement low in cases where cell density is low. This is also done to insert gaps between cells for routing. Therefore, at step 450, the location of a cell based boundary line is computed based on the current cell's initial x-coordinate and a left_factor. In one embodiment, this left_factor is a constant. In an alternate embodiment, "left_factor" is not a constant but rather is a multiplier times with the average cell width for a given cell technology. This embodiment scales better with different technologies. The cell based boundary is the left bound for the current cell. The location of the cell based boundary for the current cell is defined by:

$$xbound = x\text{-coordinate} - left\_factor$$

where xbound is the x location of the cell based boundary line, x-coordinate is the current cell's initial x-coordinate and left_factor is the value discussed above. Generally, left_factor is between 1.0 and 2.0 in practice.

Step 455 of FIG. 4C determines those sites that are invalid for the current cell. There are a number of well known processes and functions that determine invalid or incompatible locations for a cell. For instance, a substrate area may have incompatible metal layers for a given cell thereby preventing the cell from being placed in these areas. Any of number of well known methods and techniques can be used at step 455 for determining invalid placement sites for the current cell. Once determined or accessed, this information is stored in computer memory units of system 112.

At step 460 of FIG. 4C, the present invention begins scanning the individual rows to determine the left-most positioned vacant cell site for each row. At step 460, a first row is selected. At step 465, the present invention determines the left-most vacant cell site of the selected row. A cell site must align with a vertical grid line and will align with a horizontal grid line because all rows are defined based on the horizontal grid lines. A cell site is not vacant if: 1) a previously placed cell resides therein (as placed by detailed placement process 260); and/or 2) an obstruction resides thereon; and/or 3) the site is otherwise invalid for cell placement as determined by step 455. Moreover, the cell site is not valid unless it resides to the right of the cell based boundary for the current cell, e.g., it must not lie to the left of the current cell's left bound. A cell site identified at step 465 is a candidate site for detailed placement of the current cell.

At step 470, the determined candidate site of step 465 is added to a data structure ("list") that is referenced by the current cell. This data structure contains all of the identified candidate sites for the current cell. At step 475, the present invention checks if more rows need candidate site determination. If so, then step 480 obtains a next row and then step 465 is entered again and a new candidate site is located for the next row and added to the candidate site list at step 470. When all the rows to be processed have been processed, step 485 reports the candidate site list ("the group of valid sites") for the current cell as an output of process 330.

In one embodiment, all of the rows are searched from top to bottom, or vice-versa, from step 460 to step 480. However, an enhancement embodiment is to limit the row search to only a small group of rows that lie above and/or below the y-coordinate of the current cell. The group size is then determined based on a cost function related to the distance away that the row is to the current cell's y-coordinate location. An upward search can be performed first, then a downward search, if necessary, can be performed. By reducing the row scanning, the entire placement process can be shortened.

Figure 6A:
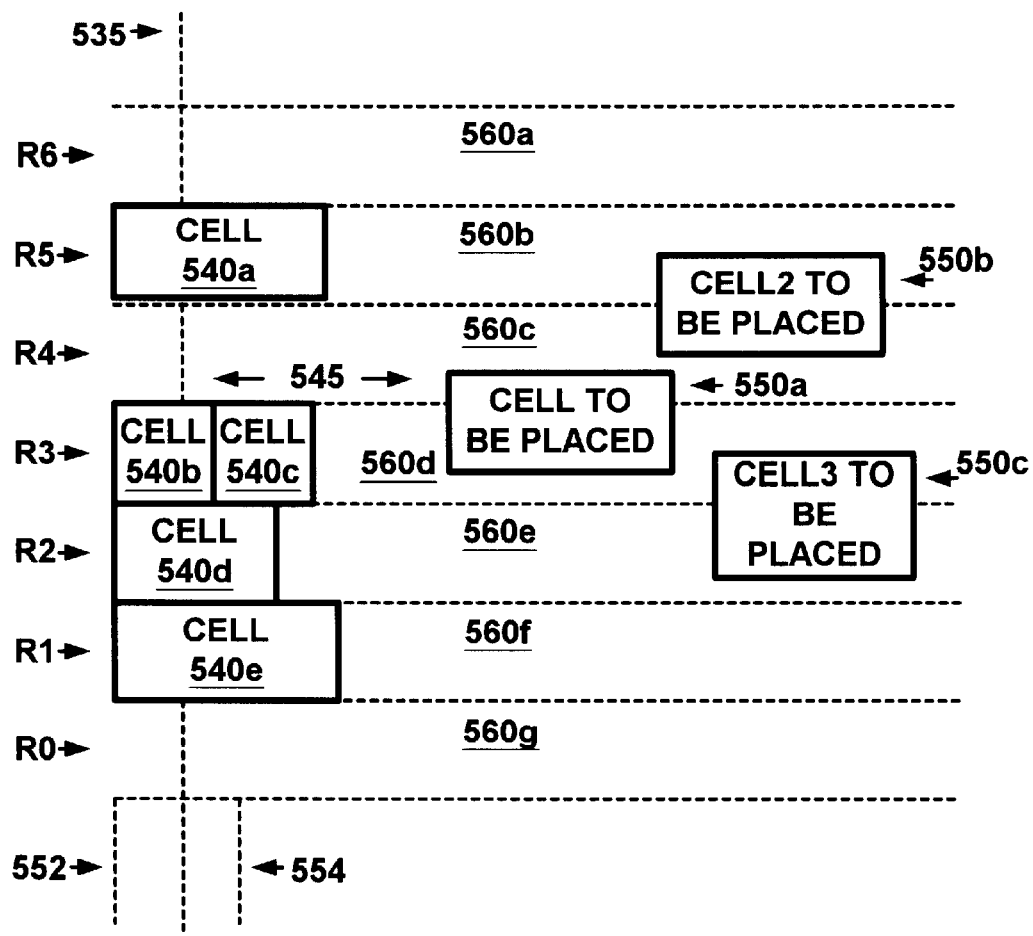
FIG. 6A is an illustration of an exemplary layout showing a partial detailed placement of some cells and illustrating a cell-to-be-placed and its candidate sites for cell placement.

FIG. 6A illustrates an example of the processing of step 330. FIG. 6A illustrates an exemplary layout portion 530 having cells 540a–540e that have already been detailed placed by process 260. Cells 550a–550c remain to be detailed placed and, specifically, cell 550a is the current cell to be placed by process 260. According to this scenario, the candidate sites for placement of current cell 550a, as determined by step 465, are shown as 560a–560g. The cell based boundary line for cell 550a is shown as boundary line 535.

Span 545 is computed at step 450 and determines the x-coordinate of boundary line 535. Exemplary vertical grid lines are shown as 552 and 554. Each site of 560a–560g aligns with the horizontal and vertical grid lines of the grid array. Candidate sites 560a–560g for cell 550a are all located to the right of the cell based boundary line 535 and respectively represent the left most vacant cell site that is also located to the right of the cell base boundary line 535 of each respective row.

Figure 6B:
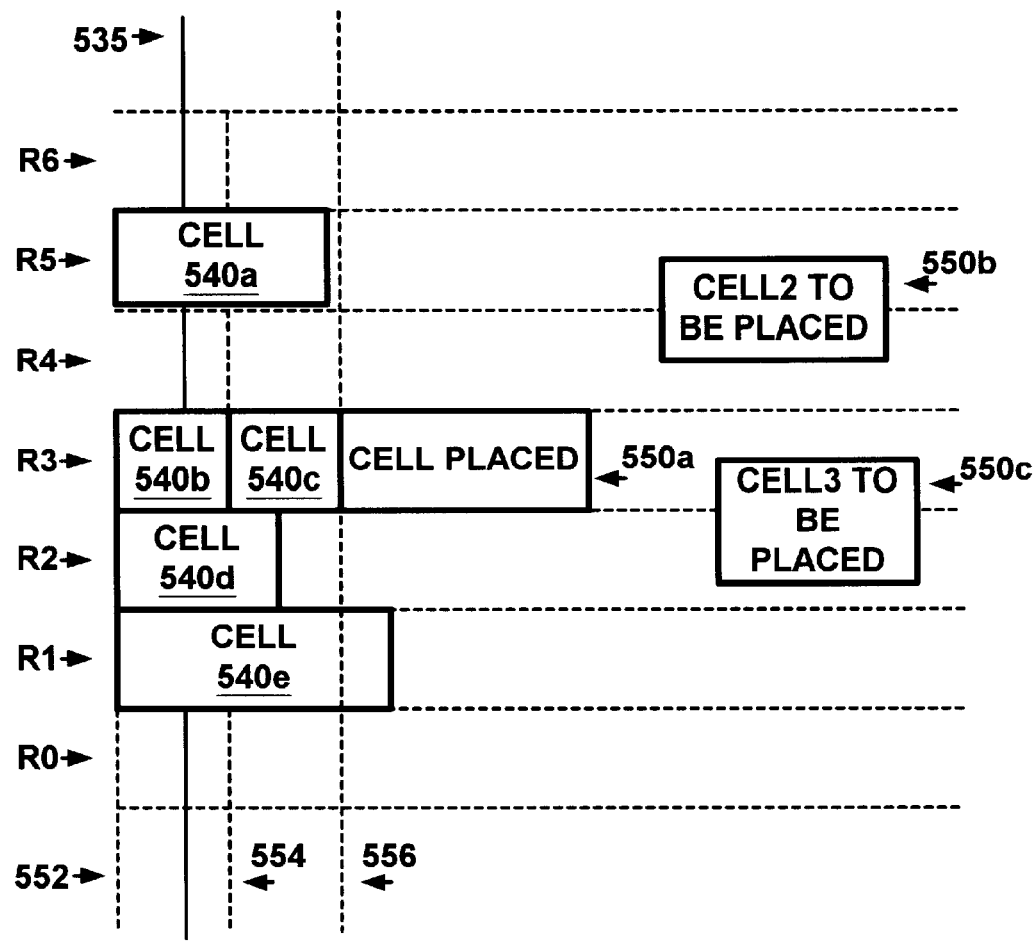
FIG. 6B illustrates the exemplary cell layout of FIG. 6A after placement of the cell-to-be-placed by the detailed placer process of the present invention.

At step 335 of FIG. 4A, the present invention selects the candidate site having the lowest cost of all the candidate sites determined at step 330 for the current cell. In one embodiment, cost is measured by cell displacement. Therefore, the lowest cost site candidate equals that candidate site that is the closest to the original cell position of the current cell. A number of different tests can be performed in the case where two or more candidate sites have the same cost. For instance, another metric such as wire length or cutsize can be used to break ties in the cost computations. Once the lowest cost candidate site is determined, step 335 moves the current cell to the lowest cost candidate site. At this time the current cell is aligned to the grid matrix. This is also referred to as detailed placement of the cell. Referring to FIG. 6A and FIG. 6B, of the candidate sites 560a–560g of FIG. 6A, site 560d is the closest site to the unaligned cell 550a. FIG. 6B illustrates the result after step 335 is processed. Specifically, cell 550a is placed into site 550d of row R3 and aligned with vertical grid line 556 and the respective horizontal grid line of row R3.

At step 340 of FIG. 4A, the present invention checks if any more cells remain to be aligned to the grid matrix (e.g., need to be detailed placed by step 355). If so, then at step 345, the next unaligned cell in the sort order is selected and step 330 is entered again to perform another detailed placement. If all of the cells are aligned, then step 350 is entered where the detailed placement of the cell is reported and the cell placement for the integrated circuit device is complete.

Figure 6C:
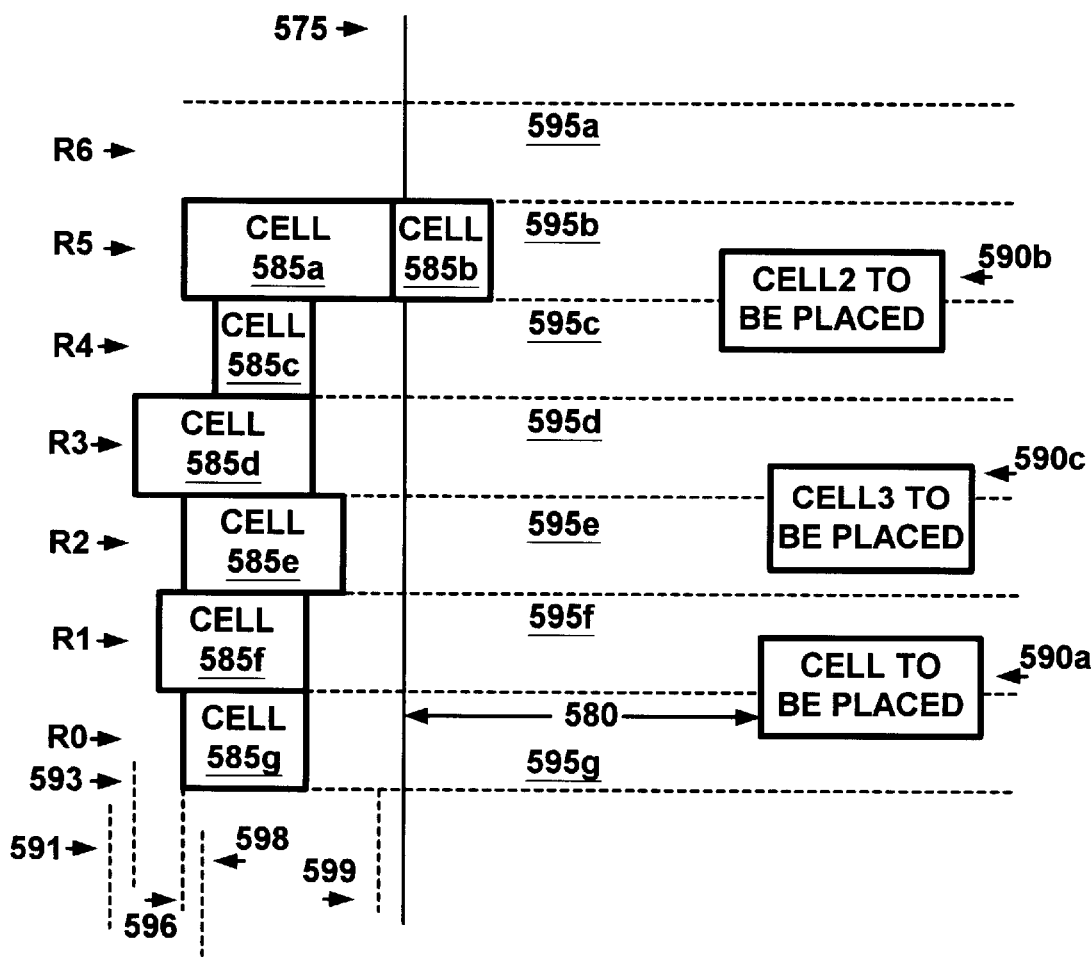
FIG. 6C is an illustration of another exemplary layout showing a partial detailed placement of some cells and illustrating a cell-to-be-placed and its candidate sites for cell placement.
Figure 6D:
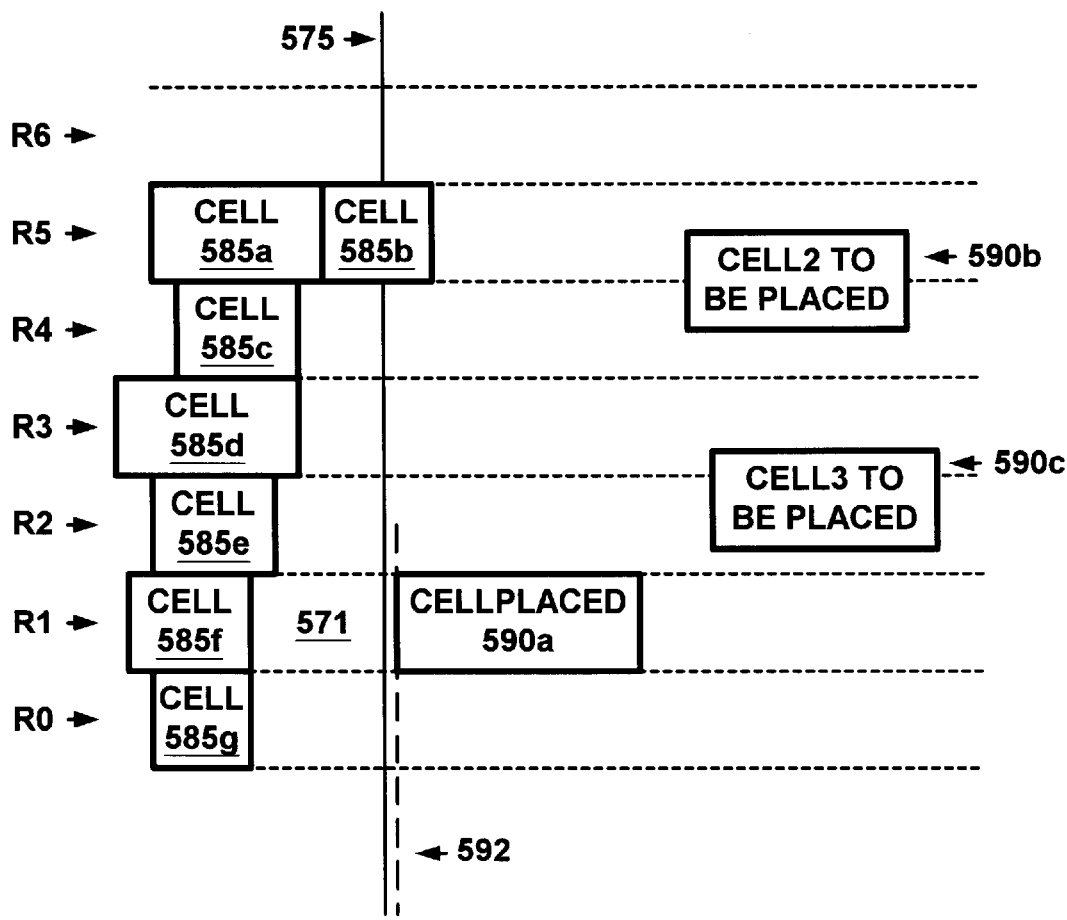
FIG. 6D illustrates the exemplary cell layout of FIG. 6C after placement of the cell-to-be-placed by the detailed place process of the present invention.

FIG. 6C and FIG. 6D illustrate another example of the processing of step 330 and step 335 of the detailed placer 260 of the present invention. This example illustrates that gaps can be included between placed cells within the detailed placer 260 of the present invention. It is appreciated that the placement process can create gaps within a row (due to the way that some large cells fit onto sites) and then fill the gaps in with smaller cells.

FIG. 6C illustrates an exemplary layout portion 570 having cells 585a–585g that have already been detailed by process 260. Cells 590a–590c remain to be detailed placed and, specifically, cell 590a is the current cell to be placed by process 260. According to this scenario, the candidate sites for placement of cell 590a, as determined by step 465, are shown as 595a–595g. The cell based boundary line for cell 590a is shown as boundary line 575. Exemplary vertical grid lines are shown as 591, 593, 596, 598 and 599. Each site of 595a–595g aligns with the horizontal and vertical grid lines of the grid array. Span 580 is computed at step 450 and determines the x-coordinate of boundary line 575. Candidate sites 595a–595g are all located to the right of the cell based boundary line 575 and respectively represent the left most vacant cell site that is also located to the right of the cell base boundary line 575 of each respective row.

With reference to FIG. 6D, of the candidate sites 595a–595g of FIG. 6C, site 595f is the closest site to the unaligned cell 590a. FIG. 6D illustrates the result after step 335 is processed and cell 590a is placed. Specifically, cell 590a is placed into site 595f of row R1 and aligned with vertical grid line 592 and the respective horizontal grid line of row R1. In this particular example, the detailed placement of cell 590a did not lie adjacent to the other cell 585f of row R1 due to the boundary line 575. Therefore, a small unused gap 571 is left between cells 585f and 590a. Gaps such as gap 571 are useful for routing wire connections during the routing processes 265 (FIG. 3) and for yielding a uniform cell distribution over the available substrate area.

It is appreciated that one advantage of the detailed placer 260 of the present invention is that cells are detailed placed in a single pass through the cells. In effect, every cell is moved only once. This is quite unlike the prior art where a trial and error processing takes place and a cell could be moved to many different locations in many passes in the attempt to avoid cell overlapping after cells were snapped to their grid locations. The single pass of the present invention yields a high quality cell placement that is free of cell-to-cell or cell-to-obstruction overlaps. In the detailed placer of the present invention, processing is complete in roughly N*log (N) time where N is the number of cells. Moreover, the detailed placer of the present invention tends not to move cells very far from their initial coordinate positions if the initial placement is reasonably distributed and the utilization is low enough that the number of free sites per row is larger than or equal to the sites required for the widest cell. In trial runs, cell movement is limited to approximately 2–4 cell diameters. Utilization is measured based on the amount of total substrate area used by the cells. The present invention as shown to be very effective at detailed placement for designs having a utilization of 97 percent or less, although the present invention can also generate a valid placement for designs having more than 97% utilization.

The width_factor and the left_factor can be adjusted for different layouts depending on the placement results determined. If a successful placement is found when the left_factor and the width_factor are low, then the result is probably very close to an optimal placement. The left_factor helps to make the final placement uniform and prevents cell clumping in cases where the cell density is very low. The effect of the width_factor is to place wider cells higher in the sort order. This is done because as the cell sites are filled in a row, the larger cells should be placed first so that space does not run out within the rows containing the larger cells. The process always has enough space on average, but placing the larger cells first tends eliminates the problems of not having enough larger spaces at the end (e.g., the right side) of the substrate area.

It is appreciated that the present invention introduces a slight cell placement bias to the left. However, because this bias effects the entire design the same way it tends to cancel itself out.

It is also appreciated that the above detailed placement process 260 has been described as working from left to right to fill the cells into the rows. It is appreciated that another embodiment of the present invention operates to fill the cell sites from right to left. In this embodiment, the cell based boundaries are computed by adding to the x-coordinate of current cell and left boundaries become right boundaries, etc. Further, the sort order is reversed. Moreover, the rightmost vacant cells sites are determined as the candidate sites within the rows, etc. Alternatively, top to bottom and bottom to top embodiments can be developed which also come within the scope of the present invention.

It is also possible to use the placement process 260 for cells that have more than one height. In this case, if the tall cells were relatively rare, e.g., equal to or less than 10 percent of the total, then this embodiment can be used. In this embodiment, the process 260 acts to bias the sorting step to place the tall cells in first, and then the small cells would fill in around them.

DETAILED PLACEMENT EXAMPLES FOR OBSTRUCTIONS AND INVALID CELL AREAS

Figure 7A:
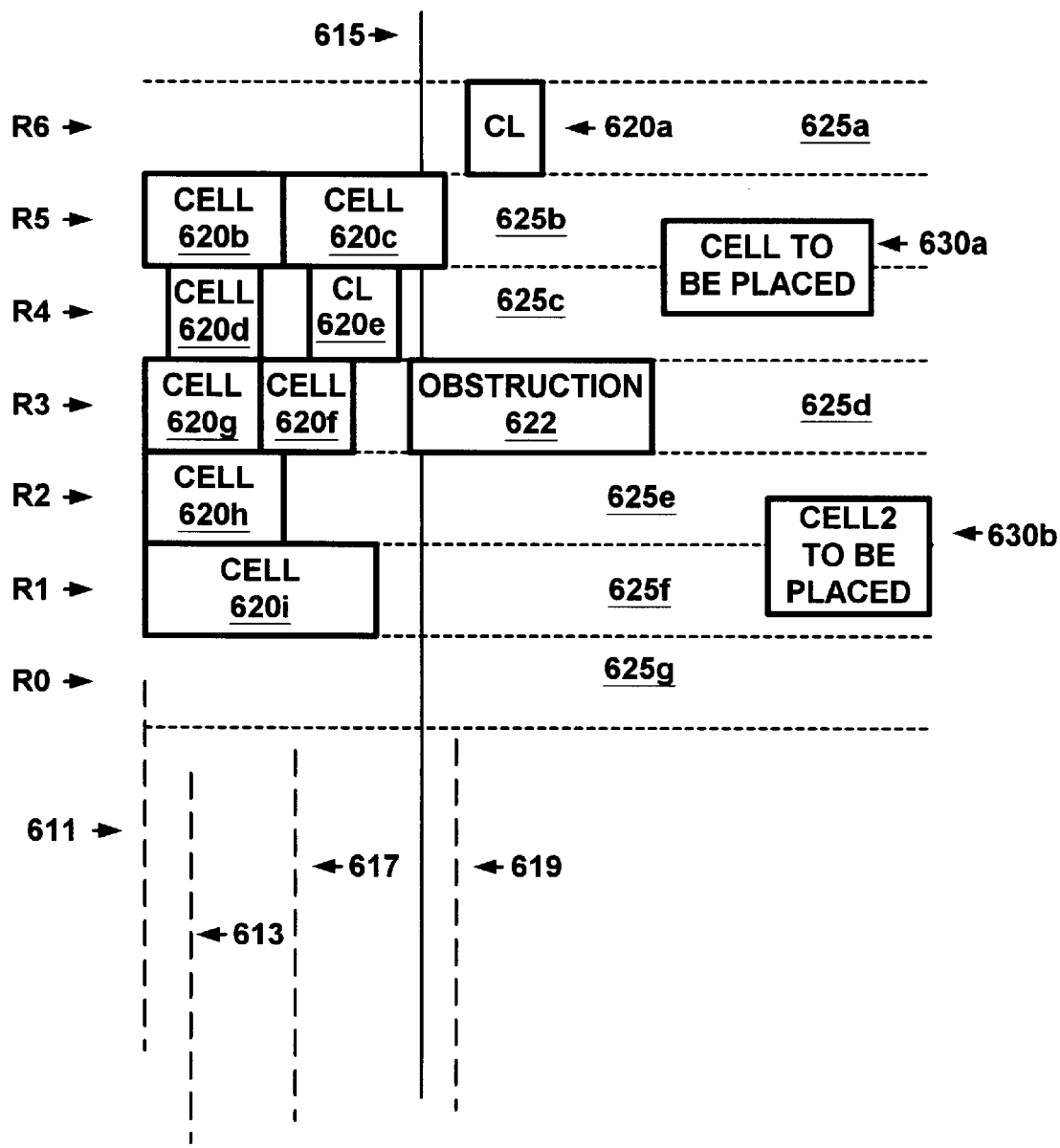
FIG. 7A is an illustration of another exemplary layout showing a partial detailed placement of some cells and illustrating a cell-to-be-placed, its candidate sites for cell placement and a cell obstruction.
Figure 7B:
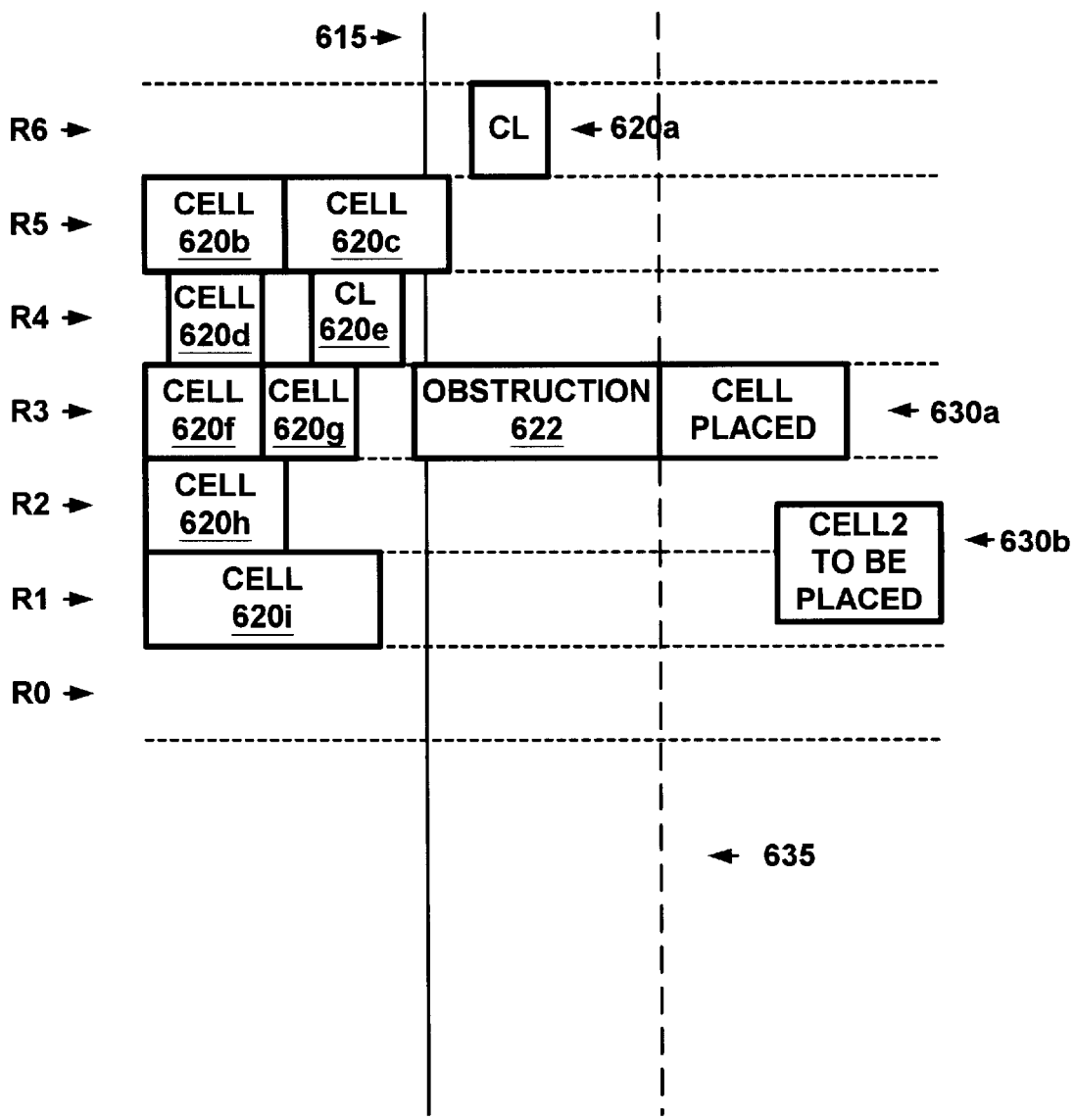
FIG. 7B illustrates the exemplary cell layout of FIG. 7A after placement of the cell-to-be-placed by the detailed placer process of the present invention.

FIG. 7A and FIG. 7B illustrate another example of the processing of step 330 and step 335 of the detailed placer 260 of the present invention. This example illustrates that the process of the detailed placer 260 of the present invention can inherently deal with obstructions in the same manner as it deals with placed cells. FIG. 7A illustrates an exemplary layout portion 610 having cells 620a–620i that have already been detailed placed by process 260. Cells 630a–630b remain to be detailed placed and, specifically, cell 630a is the current cell to be placed by process 260. According to this scenario, the candidate sites for placement of cell 630a, as determined by step 465, are shown as 625a–625g. The cell based boundary line for cell 630a is shown as boundary line 615. Candidate site 625d is determined based on the presence of the obstruction 622 which is treated like a previously placed cell to process 330. Memory cell locations can create obstruction areas for other cell types.

Exemplary vertical grid lines are shown as 611, 613, 617 and 619. Each site of 625a–625g aligns with the horizontal and vertical grid lines of the grid array. The x-coordinate of boundary line 615 is determined by step 450. Candidate sites 625a–625g are all located to the right of the cell based boundary line 615 and respectively represent the left most vacant cell site that is also located to the right of the cell base boundary line 615 of each respective row where vacancy is determined based on the absence of a previously placed cell and the absence of any obstructions.

With reference to FIG. 7B, of the candidate sites 625a–625g of FIG. 7A, site 625d is the closest site to the unaligned cell 630a. FIG. 7B illustrates the result after step 335 is processed and cell 630a is placed. Specifically, cell 630a is placed into site 625d of row R3 and aligned with vertical grid line 635 and the respective horizontal grid line of row R3. In this particular example, the detailed placement of cell 630a was based on the presence of an obstruction 622.

Figure 8A:
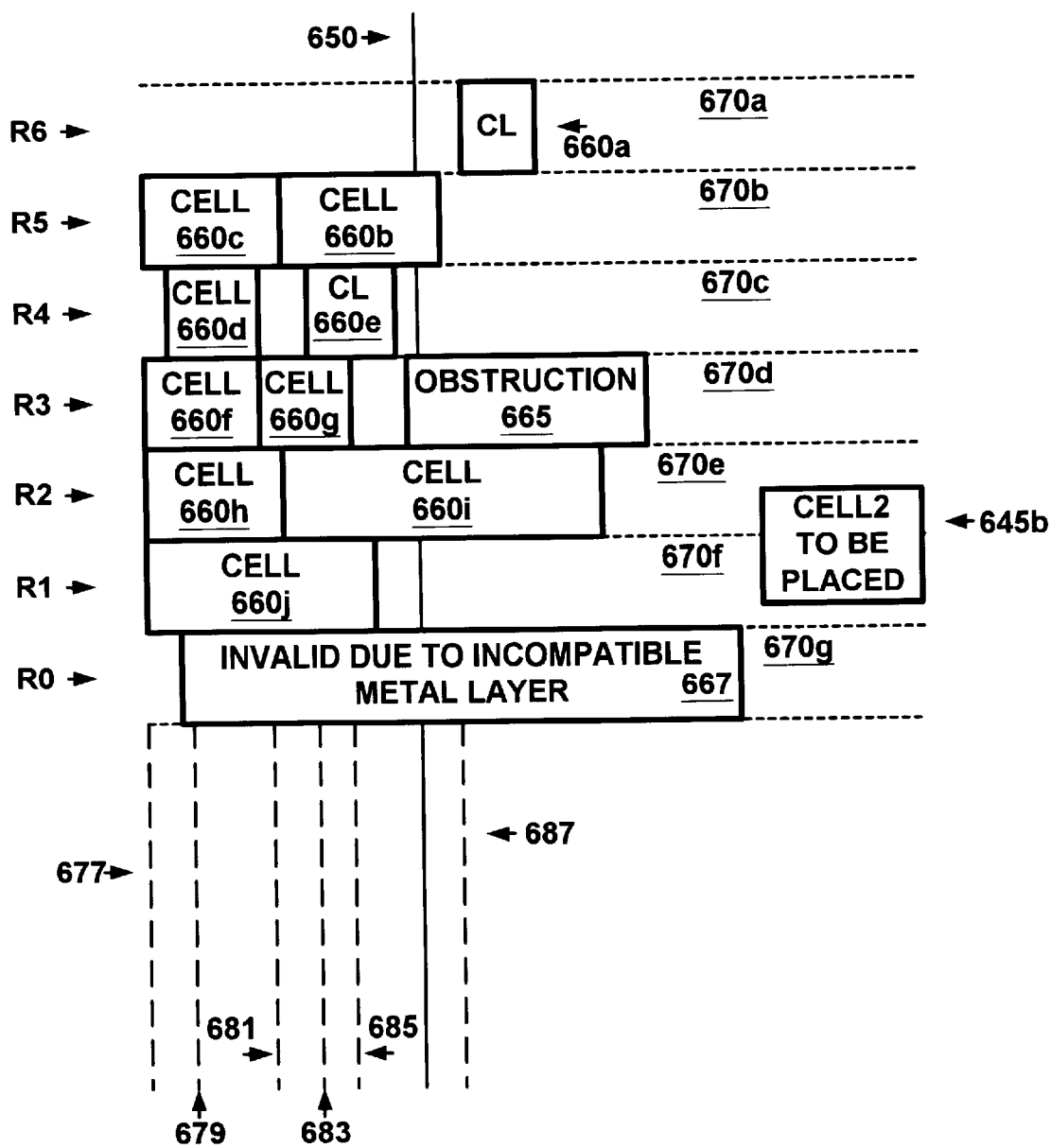
FIG. 8A is an illustration of another exemplary layout showing a partial detailed placement of some cells and illustrating a cell-to-be-placed, its candidate sites for cell placement, a cell obstruction and an invalid row section.
Figure 8B:
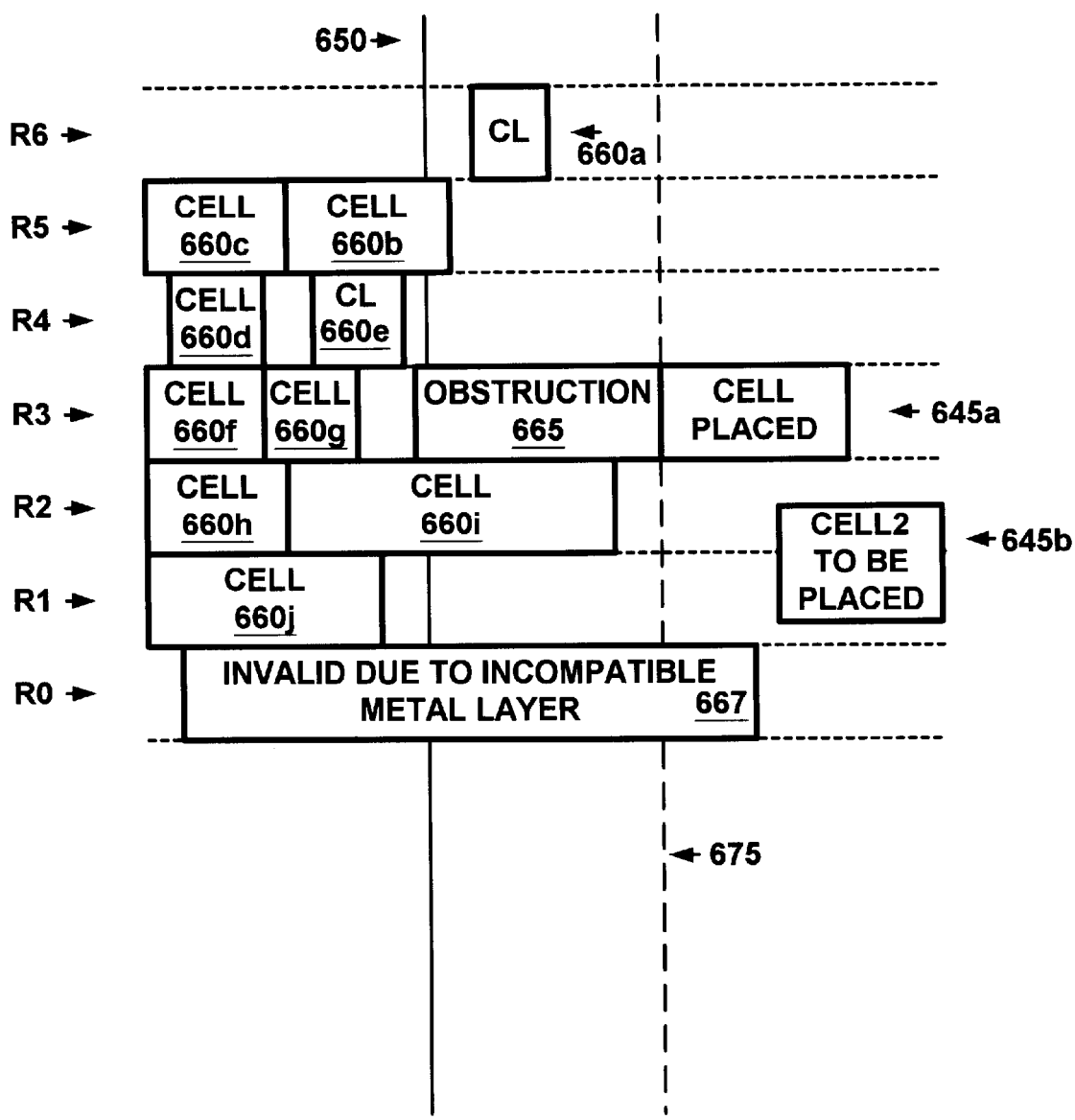
FIG. 8B illustrates the exemplary cell layout of FIG. 8A after placement of the cell-to-be-placed by the detailed placer process of the present invention.

FIG. 8A and FIG. 8B illustrate another example of the processing of step 330 and step 335 of the detailed placer 260 of the present invention. This example illustrates that the process of the detailed placer of the present invention can inherently deal with obstructions and invalid cell areas in the same manner as it deals with placed cells. An invalid cell area 667 is an area were a particular cell is not allowed to be placed, e.g., due to circuit or fabrication incompatibilities. For instance, a metal layer incompatibility can create an invalid area for cell types. Furthermore, memory cell locations can create areas of incompatibility with other cells. FIG. 8A illustrates an exemplary layout portion 640 having cells 660a–620j that have already been detailed placed by process 260. Cells 645a–645b remain to be detailed placed and, specifically, cell 645a is the current cell to be placed by process 260. According to this scenario, the candidate sites for placement of cell 645a, as determined by step 465, are shown as 670a–670g. The cell based boundary line for cell 645a is shown as boundary line 650. The x-coordinate of boundary line 650 is determined by step 450. Candidate site 670d is determined based on the presence of the obstruction 665 which is treated like a previously placed cell to process 330. Candidate site 670g is determined based on the presence of the invalid area 667 which is treated like a previously placed cell to process 330. Invalid area 667 is determined by step 455 (FIG. 4C).

Exemplary vertical grid lines are shown as 677, 679, 681, 683, 685 and 687. Each site of 670a–670g aligns with the horizontal and vertical grid lines of the grid array. Candidate sites 670a–670g are all located to the right of the cell based boundary line 650 and respectively represent the left most vacant cell site that is also located to the right of the cell base boundary line 650 of each respective row where vacancy is determined based on the absence of a previously placed cell and the absence of any obstructions and the absence of any invalid areas.

With reference to FIG. 8B, of the candidate sites 670a–670g of FIG. 8A, site 670d is the closest site to the unaligned cell 645a. FIG. 8B illustrates the result after step 335 is processed and cell 645a is placed. Specifically, cell 645a is placed into site 670d of row R3 and aligned with vertical grid line 675 and the respective horizontal grid line of row R3. In this particular example, the determination of the candidate sites is based on the presence of an invalid cell area 667.

EXEMPLARY IMPLEMENTATION CODE OF DETAILED PLACEMENT PROCESS

The detailed placer 260 of the present invention as been described with respect to the above process steps and examples. One exemplary implementation of the detailed placer 260 is shown below. It is appreciated that the below code implementation is but one example implementation and that many other implementations are possible based on the above description.

```
//    input:
//    1)   list of cells and their original positions
//         original positions may not be on sites
//         (e.g. floating point coordinates)
//         and/or may overlap each other, but they are
//         assumed to be "uniformly"
//         distributed
//
//    2)   rectangular site array, possibly with obstructions and
//         regularities
float left_factor = 1.0; // hack, inake higher (say 3) if
utilization is very high (>0.98)
//    make lower, maybe 0.6 if utilization is low (<0.9)
float width_factor = 0.5; // hack, make higher (say 1) if
utilization is very high (>0.93)
//    make lower, maybe 0.2 if utilization is low (<0.9)
//    Possible enhancement: do not use a constant "width_factor"
//    for all cells. Rather,
//    scan from right to left, and find the wide cells near fixed
//    obstacles (including
//    the right side of the die.) Only set the width factor >0 for
//    these cells.
//
float function effective_x(cell) {
    return cell.x − cell.width * width_factor;
};
function eco_place (input_cells) {
    array cell_array = input_cells;
    qsort(cell_array, effective_x, num_cells);
    widest_width = max(cell_widths of all cells);
    foreach (cell, cell_array) {
        target_x = cell.optimal.x − left_factor * widest_width;
        target_y = cell.optimal.y;
        lowest_cost = infinity;
        // Note***: to make the process faster, do not just
        //           run all the rows from bottom to top. Rather, choose
        //           rows spreading out
        //           from target_y, working upward, and then stop search
        //           when y displacement**2
```

```
//           is bigger than current search cost.
//           Then search downward. This will, in practice, limit
//           the search
//           to just a few rows.
for(row = 0; row <= top_row; row++) {
    for(col = x_to_col(target_x); col < rightmost_col;
col++) {
        if(! cell_can_fit_here(cell, col, row)) {
            continue;
        };
                        //    possible enhancement: use
                        //    another metric, such
                        //    as wirelength or cutsize, to
                        //    break ties in the displacement
                        //    metric
        cost = (site_x(col) − target₁·x)**2 +
X_TO_Y_PRIORITY_RATIO*(site_y(row)−target_y)**2;
        if(cost < lowest_cost) {
            lowest_cost = cost;
            winning_row = row;
            winning_col = col;
        };
        break;
    };
};
if(lowest_cost == infinity) {
    print ERROR: could not place cell $cell;
    continue;
};
cell.x = site_to_x(col);
cell.y = site_to_y(row);
};
//    at this point, basic ECO placement is done.
//    optional:move_cells_right a little
foreach (cell, from right to left in each row, and for all
rows) {
    row = y_to_row(cell.y);
    for(col = x_to_col(cell.x); col < num_cols; col++) {
        if(! cell_can_fit_here(cell, col, row)) {
            continue;
        };
        cost = cost_function(cell, col, row);
        if(cost < current_cost) {
            cell.x = col_to_x(col);
            current_cost = cost;
        };
    };
};
//    optimal, tune orientation
int MAX_PASSES = 2; // probably no point to do more than 2X
for(pass = 0; pass < MAX_PASSES; pass++) {
    foreach(cell from lower_left to upper_right) {
//    may want to experiment with order
        best_cost = wire_cost(cell, cell.orientation);
        original_orientation = cell.orientation;
        foreach(orientation) {
            if(cell_is_valid(cell, orientation)) {
                continue;
            };
            cost = wire_cost(cell, orientation);
            if(cost < best_cost) {
                cell.orientation = orientation;
            };
        };
    };
}
};
```

CONCLUSION

The preferred embodiment of the present invention, a detailed cell placer process, is thus described. While the present invention has been described in particular embodiments, it should be appreciated that the present invention should not be construed as limited by such embodiments, but rather construed according to the below claims.

What is claimed is:

1. A detailed placement method comprising the steps of:
   a) accessing a netlist description of an integrated circuit having cells of a common height wherein each cell has assigned thereto an initial two dimensional coordinate position within an area;
   b) sorting said cells into a sort order based on each cell's coordinate value;
   c) assigning a plurality of rows to said area;
   d) based on said sort order, selecting an unaligned cell and traversing said plurality of rows to determine candidate sites for placement of said unaligned cell wherein said candidate sites are the left-most vacant sites of each row and wherein each candidate site is aligned within a two dimensional grid matrix;
   e) placing said unaligned cell in a lowest cost candidate site of said candidate sites of step d); and
   f) aligning all of said cells to said grid matrix by repeating steps d)–e) for each cell of said netlist description.

2. A detailed placement method as described in claim 1 wherein said step e) comprises the steps of:
   e1) determining said lowest cost site by selecting a candidate site that is closest to said initial coordinate position of said unaligned cell; and
   e2) placing said unaligned cell in said lowest cost candidate site as determined at said step e1).

3. A detailed placement method as described in claim 2 wherein said coordinate value of said step b) is within a horizontal coordinate axis and wherein said step b) comprises the steps of:
   b1) assigning a new coordinate position to each cell by shifting each cells' horizontal coordinate position by an amount dependent on the width of each cell; and
   b2) weighting wider cells higher in said sort order by sorting said cells based on their new coordinate positions as determined at step b1).

4. A detailed placement method as described in claim 2 wherein step d) comprises the step of determining a left-most vacant site for a row by selecting the left-most positioned site of said row that does not contain a previously placed cell and that does not contain an obstruction.

5. A detailed placement method as described in claim 2 wherein said coordinate value of said step b) is within a horizontal coordinate axis.

6. A computer controlled detailed placement method comprising the steps of:
   a) accessing a netlist description of an integrated circuit, said netlist description having cells and wire connections between said cells wherein said cells have a common height and each have assigned thereto an initial two dimensional coordinate position within an area;
   b) sorting said cells into a sort order based on their horizontal coordinate values;
   c) assigning a plurality of rows to said area;
   d) based on said sort order, selecting a next unaligned cell and traversing said plurality of rows to determine candidate sites for placement of said unaligned cell wherein said candidate sites are the left-most vacant sites of each row that are also located to right of a cell dependent boundary line and wherein each candidate site is aligned within a two dimensional grid matrix;
   e) placing said unaligned cell in a lowest cost candidate site; and
   f) aligning all of said cells to said grid matrix by repeating steps d)–e) for each cell of said netlist description.

7. A detailed placement method as described in claim 6 wherein said step e) comprises the steps of:
   e1) determining said lowest cost site by selecting a candidate site that is closest to said initial coordinate position of said unaligned cell; and
   e2) placing said unaligned cell in said lowest cost candidate site as determined at said step e1).

8. A detailed placement method as described in claim 6 wherein said step b) comprises the steps of:
   b1) assigning a new coordinate position to each cell by shifting each cells' horizontal coordinate position by an amount dependent on the width of each cell; and
   b2) weighting wider cells higher in said sort order by sorting said cells based on their new coordinate positions as determined at step b1).

9. A detailed placement method as described in claim 6 wherein step d) comprises the steps of:
   d1) determining a position of said cell dependent boundary line by subtracting, from the horizontal position of said unaligned cell, a value dependent on the width of said unaligned cell; and
   d2) determining a left-most vacant site for a row by selecting the left-most positioned site of said row that does not contain a previously placed cell, that also does not contain an obstruction and that is also located to the right of said cell dependent boundary line.

10. A computer controlled detailed placement method comprising the steps of:
    a) accessing a netlist description of an integrated circuit, said netlist description having cells that have a common height and wherein each cell has assigned thereto an initial two dimensional coordinate position within an area;
    b) sorting said cells into a sort order based on their horizontal coordinate values;
    c) assigning a plurality of rows to said area;
    d) based on said sort order, selecting an unaligned cell and traversing said plurality of rows to determine candidate sites for placement of said unaligned cell wherein said candidate sites are the right-most vacant sites of each row and wherein each candidate site is aligned within a two dimensional grid matrix;
    e) placing said unaligned cell in a lowest cost candidate site; and
    f) aligning all of said cells to said grid matrix by repeating steps d)–e) for each cell of said netlist description.

11. A detailed placement method as described in claim 10 wherein said step e) comprises the steps of:
    e1) determining said lowest cost site by selecting the candidate site that is closest to said initial coordinate position of said unaligned cell; and
    e2) placing said unaligned cell in said lowest cost candidate site as determined by said step e1).

12. A detailed placement method as described in claim 11 wherein said step b) comprises the steps of:
    b1) assigning a new coordinate position to each cell by shifting each cells' horizontal coordinate position by an amount dependent on the width of each cell; and
    b2) weighting wider cells higher in said sort order by sorting said cells based on their new coordinate positions as determined by step b1).

13. A detailed placement method as described in claim 11 wherein step d) comprises the step of determining a rightmost vacant site for a row by selecting the right-most positioned site of said row that does not contain a previously placed cell and that does not contain an obstruction.

14. A computer system comprising a processor coupled to a bus and a memory unit coupled to said bus, said memory unit having stored thereon instructions that when execution implement a computer controlled detailed placement method comprising the steps of:

a) accessing a netlist description of an integrated circuit having cells of a common height wherein each cell has assigned thereto an initial two dimensional coordinate position within an area;

b) sorting said cells into a sort order based on a coordinate value of each cell;

c) assigning a plurality of rows to said area;

d) based on said sort order, selecting an unaligned cell and traversing said plurality of rows to determine candidate sites for placement of said unaligned cell wherein said candidate sites are the left-most vacant sites of each row and wherein each candidate site is aligned within a two dimensional grid matrix;

e) placing said unaligned cell in a lowest cost candidate site; and f) aligning all of said cells to said grid matrix by repeating steps d)–e) for each cell of said netlist description.

15. A computer system as described in claim 14 wherein said step e) of said method comprises the steps of:

e1) determining said lowest cost site by selecting a candidate site that is closest to said initial coordinate position of said unaligned cell; and e2) placing said unaligned cell in said lowest cost candidate site as determined at said step e1).

16. A computer system as described in claim 15 wherein said coordinate value of said step b) is along a horizontal coordinate axis and wherein said step b) comprises the steps of:

b1) assigning a new coordinate position to each cell by shifting each cells' horizontal coordinate position by an amount dependent on the width of each cell; and b2) weighting wider cells higher in said sort order by sorting said cells based on their new coordinate positions as determined at step b1).

17. A computer system as described in claim 15 wherein step d) comprises the step of determining a left-most vacant site for a row by selecting the left-most positioned site of said row that does not contain a previously placed cell and that does not contain an obstruction.

18. A computer system as described in claim 15 wherein step d) comprises the steps of:

d1) determining a position of a cell dependent boundary line by subtracting, from the horizontal position of said unaligned cell, a value dependent on the width of said unaligned cell; and d2) determining a left-most vacant site for a row by selecting the left-most positioned site of said row that does not contain a previously placed cell, that does not also contain an obstruction and that is located to the right of said cell dependent boundary line.

* * * * *